(12) United States Patent
Narita et al.

(10) Patent No.: US 8,884,447 B2
(45) Date of Patent: Nov. 11, 2014

(54) SEMICONDUCTOR DEVICE AND METHOD OF MANUFACTURING THE SAME

(75) Inventors: Hiroaki Narita, Tsuruta (JP); Ken Masuta, Tsuruta (JP); Toru Makanae, Tsuruta (JP)

(73) Assignee: Renesas Electronics Corporation, Kanagawa (JP)

( * ) Notice: Subject to any disclaimer, the term of this patent is extended or adjusted under 35 U.S.C. 154(b) by 65 days.

(21) Appl. No.: 13/471,895

(22) Filed: May 15, 2012

(65) Prior Publication Data

US 2012/0292760 A1 Nov. 22, 2012

(30) Foreign Application Priority Data

May 17, 2011 (JP) .................................. 2011-110189

(51) Int. Cl.
*H01L 23/48* (2006.01)
*H01L 23/52* (2006.01)
*H01L 29/40* (2006.01)
*H01L 21/56* (2006.01)
*H01L 23/495* (2006.01)
*H01L 23/31* (2006.01)
*H01L 23/00* (2006.01)

(52) U.S. Cl.
CPC .......... *H01L 23/3107* (2013.01); *H01L 21/561* (2013.01); *H01L 23/49541* (2013.01); *H01L 2224/81206* (2013.01); *H01L 24/13* (2013.01); *H01L 24/81* (2013.01); *H01L 2224/13144* (2013.01); *H01L 2224/05567* (2013.01); *H01L 2224/81385* (2013.01); *H01L 23/49548* (2013.01); *H01L 2224/0401* (2013.01); *H01L 2224/13022* (2013.01); *H01L 2224/94* (2013.01); *H01L 2924/01029* (2013.01); *H01L 21/568* (2013.01); *H01L 2224/81207* (2013.01); *H01L 2224/16245* (2013.01); *H01L 2224/81005* (2013.01); *H10L 2224/81439* (2013.01); *H01L 23/49582* (2013.01); *H01L 24/97* (2013.01); *H01L 2224/1134* (2013.01); *H01L 2224/81444* (2013.01); *H01L 2224/75745* (2013.01); *H01L 2224/05573* (2013.01); *H01L 2224/05624* (2013.01)

USPC ............................ 257/779; 257/737; 257/738

(58) Field of Classification Search
USPC ......................... 257/666, 708; 438/121, 123
See application file for complete search history.

(56) References Cited

U.S. PATENT DOCUMENTS

| | | | | |
|---|---|---|---|---|
| 5,316,788 | A * | 5/1994 | Dibble et al. | 430/314 |
| 5,914,536 | A * | 6/1999 | Shizuki et al. | 257/778 |
| 6,737,353 | B2 * | 5/2004 | Fang et al. | 438/652 |
| 7,776,735 | B2 * | 8/2010 | Suga et al. | 438/612 |
| 7,851,902 | B2 * | 12/2010 | Masuda et al. | 257/692 |
| 8,063,471 | B2 * | 11/2011 | Aruga et al. | 257/666 |
| 2004/0245648 | A1 * | 12/2004 | Nagasawa et al. | 257/772 |

(Continued)

FOREIGN PATENT DOCUMENTS

| | | |
|---|---|---|
| JP | 2006-093556 A | 4/2006 |
| JP | 2008-047836 A | 2/2008 |

*Primary Examiner* — David Zarneke
(74) *Attorney, Agent, or Firm* — Mattingly & Malur, PC

(57) ABSTRACT

To increase the manufacturing yield of semiconductor devices by improving a joint failure of a bump electrode.
In a semiconductor device in which a plurality of boding pads 4 formed on a front surface of a semiconductor chip 3 and a plurality of leads 2 are connected via a plurality of bump electrodes 5, respectively, the upper surface of the leads 2 is formed into a semi-glossy surface having a roughness a maximum height (Ry) of which is in a range greater than 0 μm and not greater than 20 μm (0 μm<maximum height (Ry)≤20 μm), not into a planar surface (maximum height (Ry) =0).

8 Claims, 28 Drawing Sheets

(56) References Cited

U.S. PATENT DOCUMENTS

| | | |
|---|---|---|
| 2009/0140411 A1* | 6/2009 | Masuda et al. ............... 257/692 |
| 2009/0202915 A1* | 8/2009 | Modeki et al. ............... 429/246 |
| 2010/0072584 A1* | 3/2010 | Aruga et al. ............... 257/666 |
| 2010/0147355 A1* | 6/2010 | Shimizu et al. ............... 136/244 |
| 2012/0211269 A1* | 8/2012 | Saitou et al. ............... 174/260 |

* cited by examiner

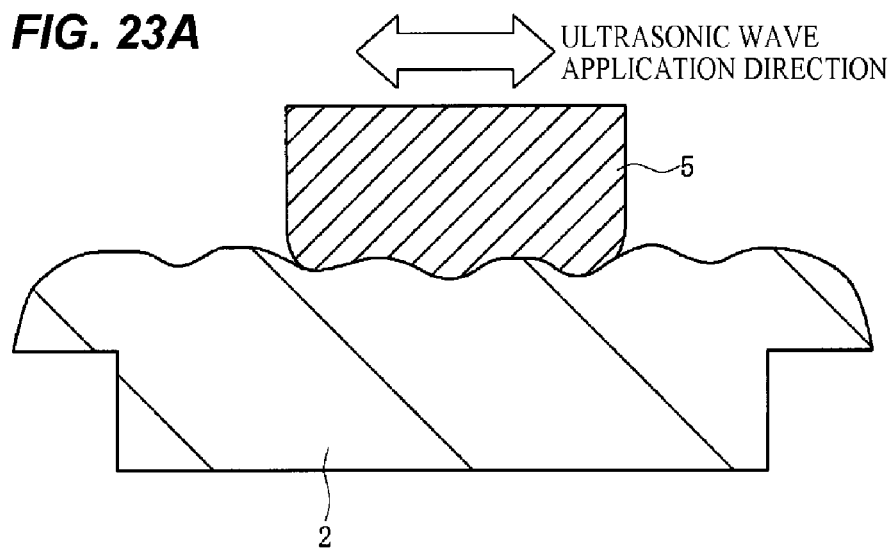
FIG. 23A  ULTRASONIC WAVE APPLICATION DIRECTION
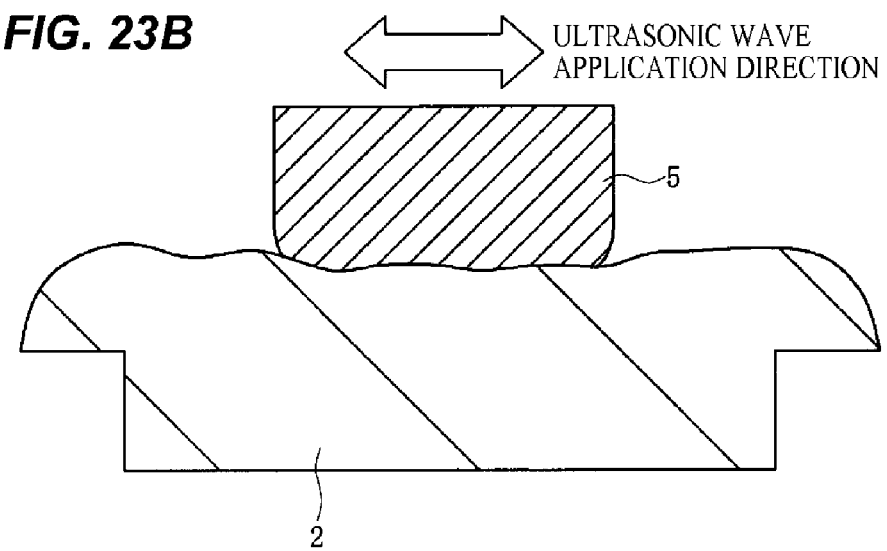
FIG. 23B  ULTRASONIC WAVE APPLICATION DIRECTION

SEMICONDUCTOR DEVICE AND METHOD OF MANUFACTURING THE SAME

CROSS-REFERENCE TO RELATED APPLICATION

The disclosure of Japanese Patent Application No. 2011-110189 filed on May 17, 2011 including the specification, drawings and abstract is incorporated herein by reference in its entirety.

BACKGROUND

The present invention relates to a semiconductor device and its semiconductor manufacturing technology and particularly, to technology effective when applied to a semiconductor device having a joint at which a bonding pad formed on the front surface of a semiconductor chip and an external terminal are electrically connected via a bump electrode.

For example, Japanese Patent Laid-Open No. 2008-47836 (Patent Document 1) describes a semiconductor device in which an optical semiconductor element, a metal plate used as an external terminal, and a bump are covered with a resin and discloses an aspect in which the respective lower-surfaces of the metal plates are located over a common virtual plane and exposed without being covered with the resin.

Further, Japanese Patent Laid-Open No. 2006-93556 (Patent Document 2) describes a semiconductor device including a terminal including a flat wire including an electrolytic plated layer joined to a metal bump, a bed part having a heat dissipating structure joined to a second main surface of a semiconductor element, and a resin sealing body that seals the semiconductor element and the metal bump and discloses that each surface of the electrolytic plated layer and the bed part is exposed from the resin sealing body.

SUMMARY

Accompanying the reduction in size and thickness of electronics, a semiconductor device (semiconductor package) mounted in electronics is also requested to reduce its size and thickness.

To reduce size and thickness of a semiconductor device, for example, as described in Patent Document 1 or Patent Document 2, the structure is thought to be effective in which the lead (terminal, metal plate, electrically conductive pattern) that serves as an external terminal is formed by the plating method and further, the lead and the bonding pad (electrode pad, surface electrode) formed on the front surface of the semiconductor chip are electrically connected via the bump electrode (bump, metal bump, projecting electrode). Then, the semiconductor chip is mounted (flip chip-bonded) over the upper surface of the lead.

However, according to the study conducted by the inventors of the present application, the semiconductor device having such a structure has various technical problems, which are explained below.

It has been made clear that a joint failure occurs in which the bump electrode peels off from the upper surface of the lead. This joint failure is thought to result from the rough upper surface of the lead formed by the plating method. We have planarized the upper surface of the lead by adding an additive to a plating solution that is used. The joint strength of the lead and the bump electrode has improved, but the formed lead becomes brittle. Thus, it is difficult to improve the joint failure of the bump electrode only by adding the additive to the plating solution to planarize the upper surface of the lead.

The present invention has been made in the above circumstances and provides technology capable of improving the manufacturing yield of semiconductor devices by improving the joint failure of the bump electrode.

The other purposes and the new feature of the present invention will become clear from the description of the present specification and the accompanying drawings.

The following explains briefly a typical embodiment among the inventions disclosed in the present application.

The embodiment is a semiconductor device including a plurality of leads and a semiconductor chip disposed over the upper surface of the leads, in which the semiconductor chip has a front surface on which a plurality of bonding pads is formed and a back surface opposite to the front surface, the bonding pads formed on the front surface of the semiconductor chip and the leads are connected via the bump electrodes, respectively, and the maximum height of the roughness of the upper surface of each lead is set to a range greater than 0 μm and not greater than 20 μm.

The following explains briefly the effect acquired by the typical embodiment among the inventions disclosed in the present application.

By improving the joint failure of the bump electrode, it is possible to improve the manufacturing yield of semiconductor devices.

BRIEF DESCRIPTION OF THE DRAWINGS

FIGS. 9(a) and 9(b) are explanatory diagrams during the manufacturing process for explaining the method of manufacturing the semiconductor device according to the first embodiment of the present invention (explanatory diagram following FIG. 8), in which FIG. 9(a) is a plan view of essential parts of the semiconductor device and FIG. 9(b) is a sectional view of essential parts of the semiconductor device.

FIG. 23($a$) is a schematic diagram of the joint for explaining joining of the lead having a rough upper surface and the bump electrode according to the first embodiment of the present invention. FIG. 23($b$) is a schematic diagram of the joint for explaining joining of the lead having a comparatively planar upper surface and the bump electrode according to the first embodiment of the present invention.

DETAILED DESCRIPTION

Figure 1:
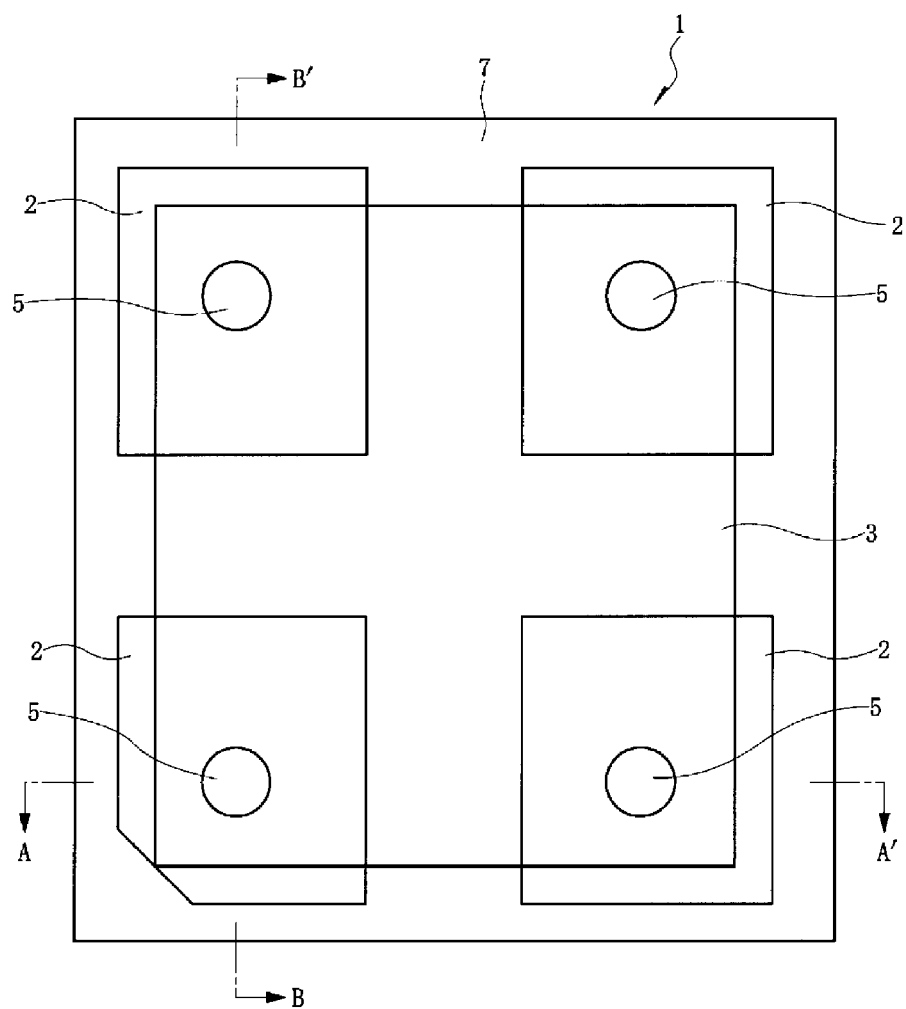
FIG. 1 is a plan view of essential parts of a semiconductor device in a first embodiment of the present invention when viewed through a sealing body.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, and a range), they may be not restricted to the specific number but may be greater or smaller than the specific number, except for the case where they are clearly specified in particular and where they are clearly restricted to a specific number theoretically. Furthermore, in the following embodiments, an element (including an element step) is not necessarily indispensable, except for the case where it is clearly specified in particular and where it is considered to be clearly indispensable from a theoretical point of view. Similarly, in the following embodiments, when referring to shape and position relationship of an element, what resembles or is similar to the shape substantially shall be included, except for the case where it is clearly specified in particular and where it is considered to be clearly not right from a theoretical point of view. This statement also applies to the numeric value and range described above.

In the drawings used in the following embodiments, to make a drawing intelligible, hatching may be attached even if it is a plan view. In the following embodiments, when referring to a wafer, it is a silicon (Si) single crystal waver in most cases, but, not restricted to this, and a silicon on insulator (SOI) wafer, and an insulating film substrate on which an integrated circuit is formed are included. The shape of the wafer is not restricted to a circle or substantially a circle, and a square, rectangle, and other shapes are also included.

In all the drawings for explaining the following embodiments, the same symbol is attached to the member having the same function, as a principle, and the repeated explanation is omitted. Embodiments of the present invention are explained in detail based on the drawing.

(First Embodiment)<<About Semiconductor Device>>

Figure 2:
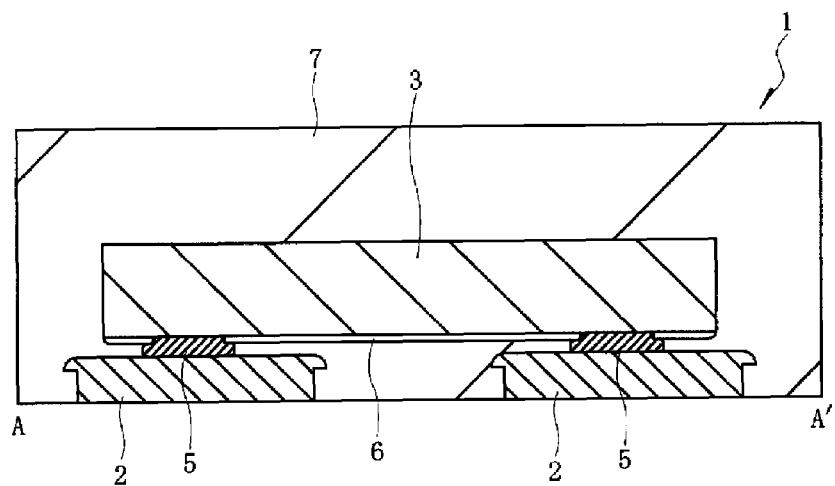
FIG. 2 is a sectional view of essential parts of the semiconductor device along A-A' line shown in FIG. 1.
Figure 3:
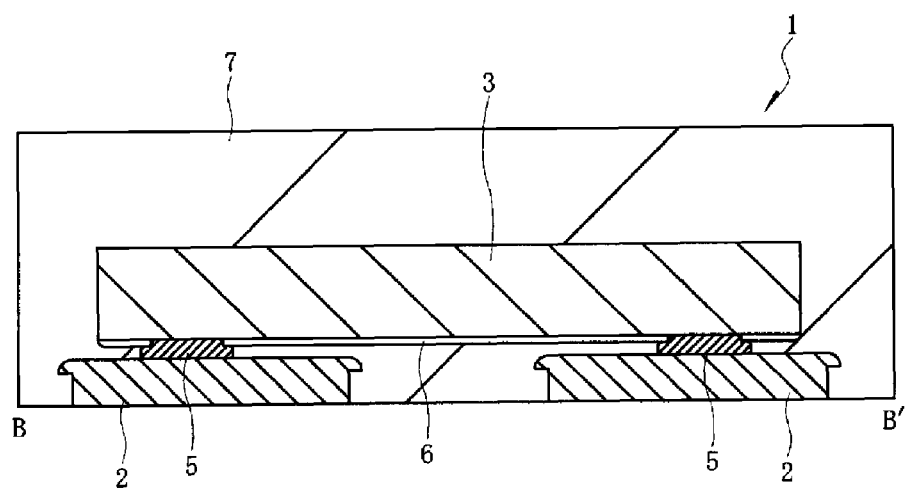
FIG. 3 is a sectional view of essential parts of the semiconductor device along B-B' line shown in FIG. 1.
Figure 4:
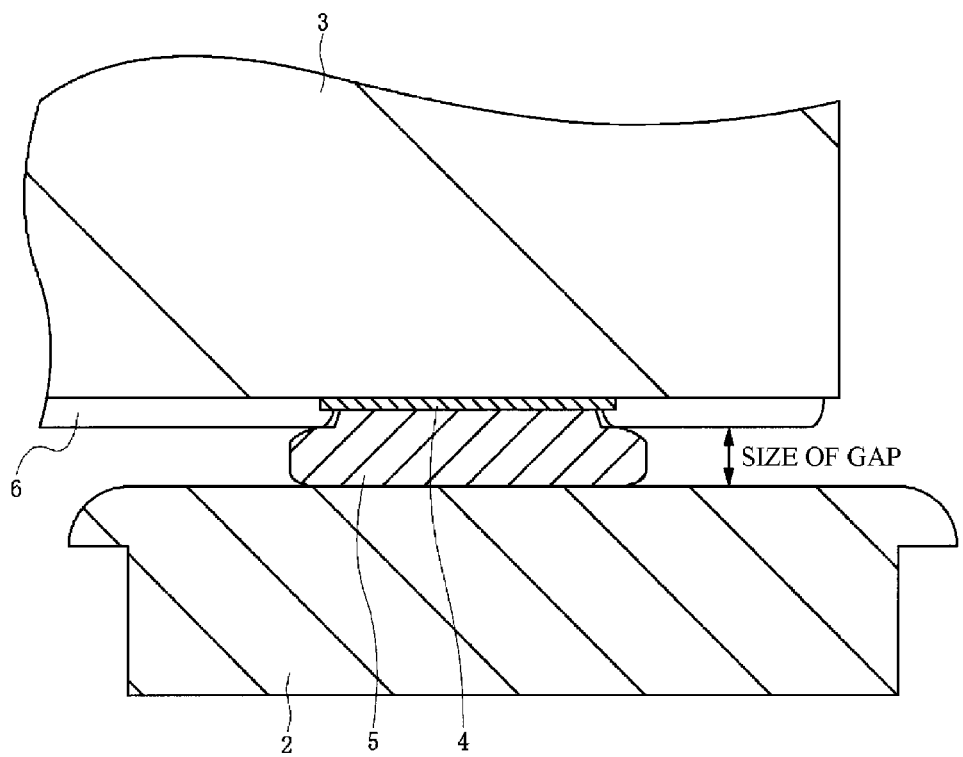
FIG. 4 is a sectional view of essential parts showing an enlarged view of a region of a bump electrode of the semiconductor device in the first embodiment of the present invention.
Figure 5:
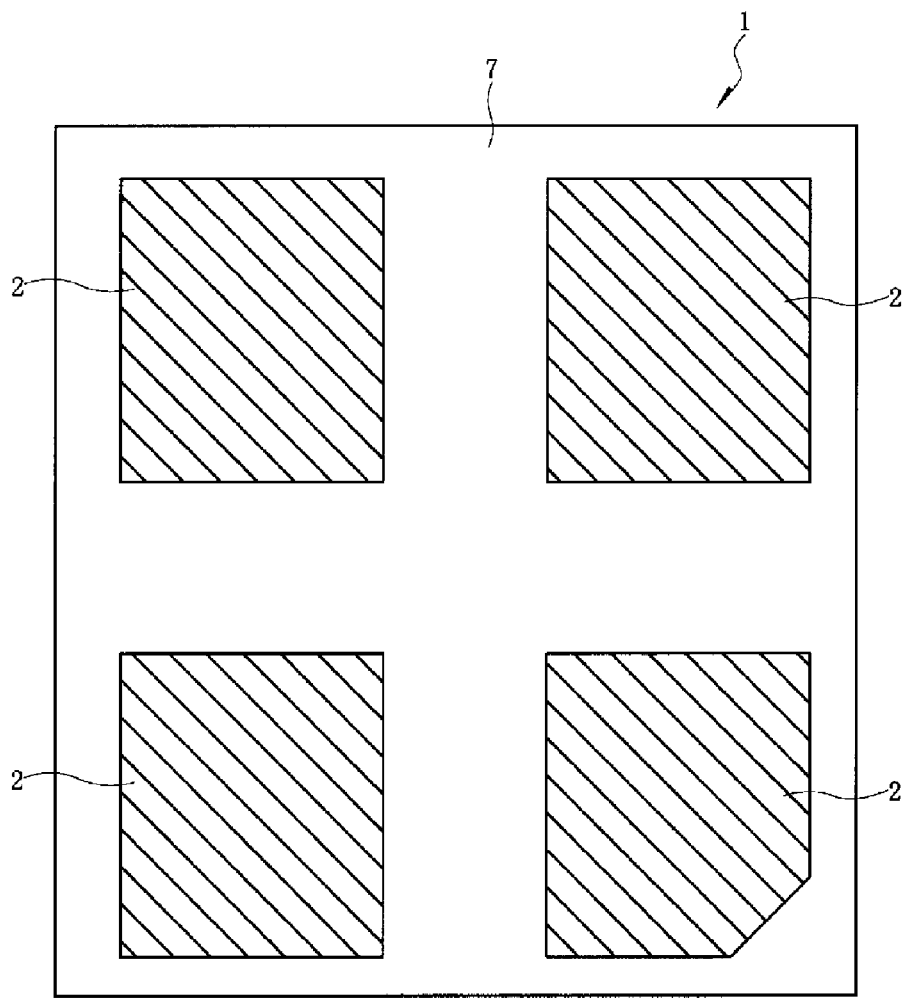
FIG. 5 is a plan view of essential parts showing a lower surface of the semiconductor device in the first embodiment of the present invention.

A semiconductor device in a first embodiment is explained using FIG. 1 to FIG. 5. FIG. 1 is a plan view of essential parts of the semiconductor device when viewed through a sealing body. FIG. 2 is a sectional view of essential parts of the semiconductor device along A-A' line shown in FIG. 1. FIG. 3 is a sectional view of essential parts of the semiconductor device along B-B' line shown in FIG. 1. FIG. 4 is a sectional view of essential parts showing an enlarged view of a region of a bump electrode. FIG. 5 is a plan view of essential parts showing a lower surface of the semiconductor device.

A semiconductor device 1 includes a plurality of leads (terminal, metal plate, electrically conductive pattern) 2 formed by the plating method, a semiconductor chip 3, and a plurality of bump electrodes (bump, metal bump, projecting electrode) 5 that electrically connects the leads 2 and a plurality of bonding pads (electrode pad, surface electrode) 4 formed on a front surface (main surface) of the semiconductor chip 3, respectively.

The leads 2 each have an upper surface (front surface) and a lower surface (back surface, mounting surface) opposite to the upper surface. The leads 2 are a plated film (aggregate of metal particles) formed (deposited) by the plating method and specifically, a nickel (Ni) film is deposited over a gold (Au) film and a silver (Ag) film is further deposited over the nickel film. The thickness of the gold film is 0.03 μm, that of the nickel film is 60 μm, and that of the silver film is 3 μm. Consequently, on each of the upper surfaces of the leads 2 to which each of the bump electrodes 5 is joined (connected), the silver film is formed. At each of joints of the leads 2 and the bumps 5, a gold-silver alloy film is formed by alloy junction. It may also be possible to form a gold film over the nickel film in place of the silver film. In this case, at each of the joints of the leads 2 and the bumps 5, a gold film is formed by mechanical junction.

The semiconductor chip 3 has a front surface and a back surface opposite to the front surface. On the side of the front surface of the semiconductor chip 3, an integrated circuit including a plurality of semiconductor elements, a multilayer wiring layer in which a plurality of insulating layers and a plurality of wiring layers are stacked, and a surface protective film 6 formed to cover the multilayer wiring layer is formed.

The semiconductor chip 3 has the bonding pads 4 on the front surface and the bump electrodes 5 formed on (joined to (connected to)) the bonding pads 4. The bonding pads 4 each include the wire, such as aluminum (Al), in the uppermost layer of the multilayer wiring (not shown schematically) formed in the integrated circuit and are exposed from openings formed in the surface protective film 6 to protect the integrated circuit. The bump electrodes 5 include gold and are joined to the bonding pads 4 in the openings formed in the surface protective film 6. The front surface of the semiconductor chip 3 and the upper surfaces of the leads 2 face each other and the leads 2 and the bump electrodes 5 are joined. The semiconductor chip 3 is disposed (mounted) over the upper surfaces of the leads 2.

Further, each part (upper surface and side surface) of the leads 2, the semiconductor chip 3, and the bump electrodes 5 is sealed by a resin sealing body (sealing body) 7. Consequently, the joints of the leads 2 and the bump electrodes 5 are sealed by the resin sealing body 7. However, the structure is such that the other parts (lower surface, back surface, mounting surface) of the leads 2 are exposed from the lower surface (back surface) of the resin sealing body 7. Between the surface protective film 6 formed on the front surface of the semiconductor chip 3 and the leads 2, a predetermined distance (size of gap shown in FIG. 4) is kept and the resin sealing body 7 is formed.

The bump electrodes 5 are joined to the upper surfaces of the leads 2 but each of the upper surfaces of the leads 2 is not a planar surface (maximum height (Ry)=0) but a surface having a roughness the maximum height (Ry) of which is in a range greater than 0 μm and not greater than 20 μm (0 μm<maximum height (Ry)≤20 μm). Further, an arithmetic mean roughness (Ra) of each of the upper surfaces of the leads 2 is in a range greater than 0 μm and not greater than 0.7 μm (0 μm<arithmetic mean roughness (Ra)≤0.7 μm). The maximum height (Ry) refers to a value expressed in terms of micrometers, which is obtained by extracting a reference length in the direction of the mean line from the roughness curve and measuring the distance between the crest line and the trough line of the extracted part in the direction of the longitudinal magnification of the roughness curve. The arithmetic mean roughness (Ra) refers to a value expressed in terms of micrometers, which is obtained from the following expression by extracting a reference length in the direction of the mean line from the roughness curve, setting an X axis in the mean line direction of the extracted part and a Y axis in the longitudinal magnification direction, and expressing the roughness curve as y=f (x). [Expression 1].

As described above, in the semiconductor device 1 according to the first embodiment, the roughness (the maximum height (Ry) and the arithmetic mean roughness (Ra)) of the upper surfaces of the leads 2 is set to a predetermined range. The effects and workings are described later. This allows to increase the joint strength at each of the joints of the leads 2 and the bump electrodes 5.

<<About Method of Manufacturing Semiconductor Device>>

Figure 6:
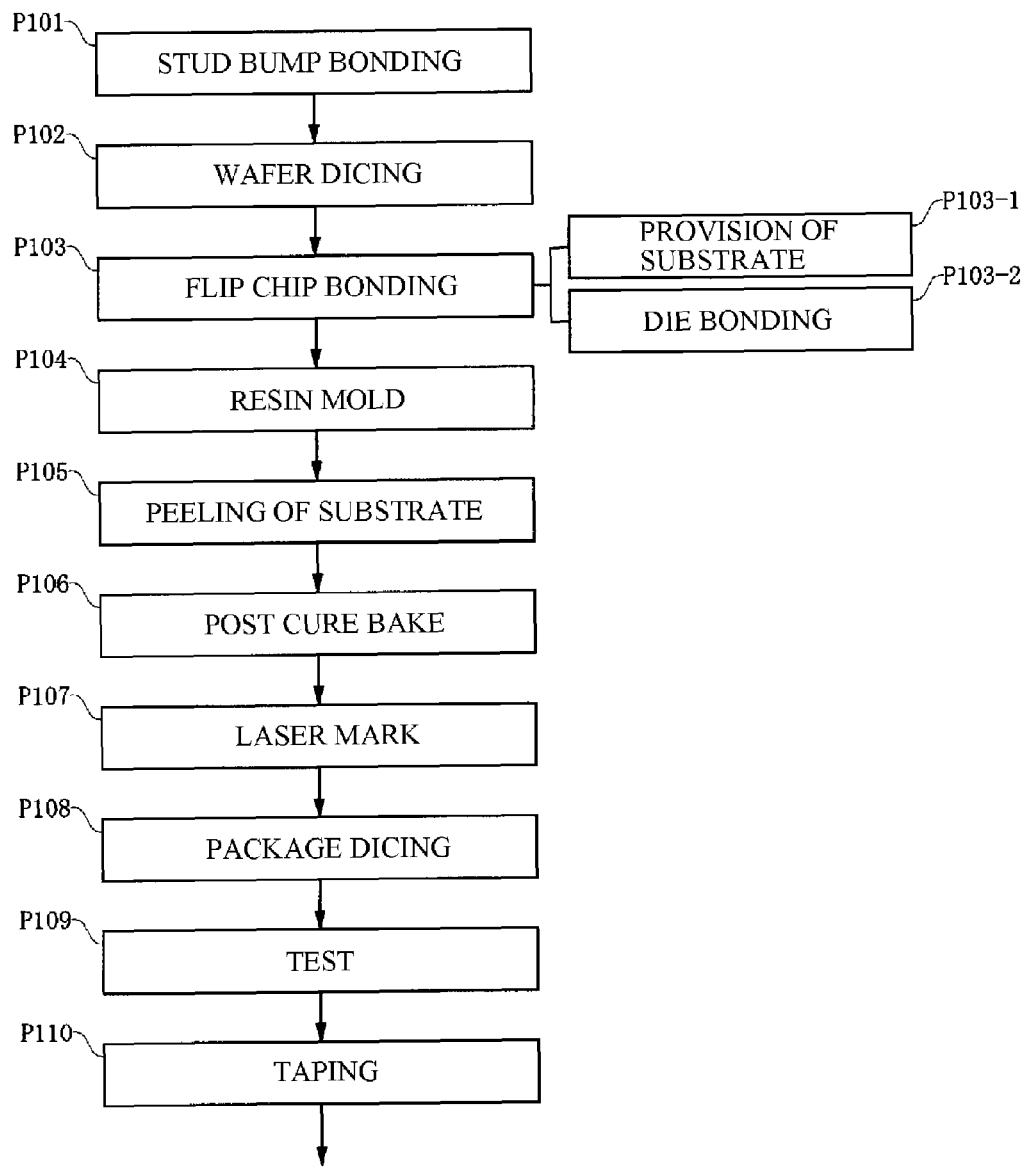
FIG. 6 is a process chart for explaining a method of manufacturing a semiconductor device according to the first embodiment of the present invention.
Figure 7:
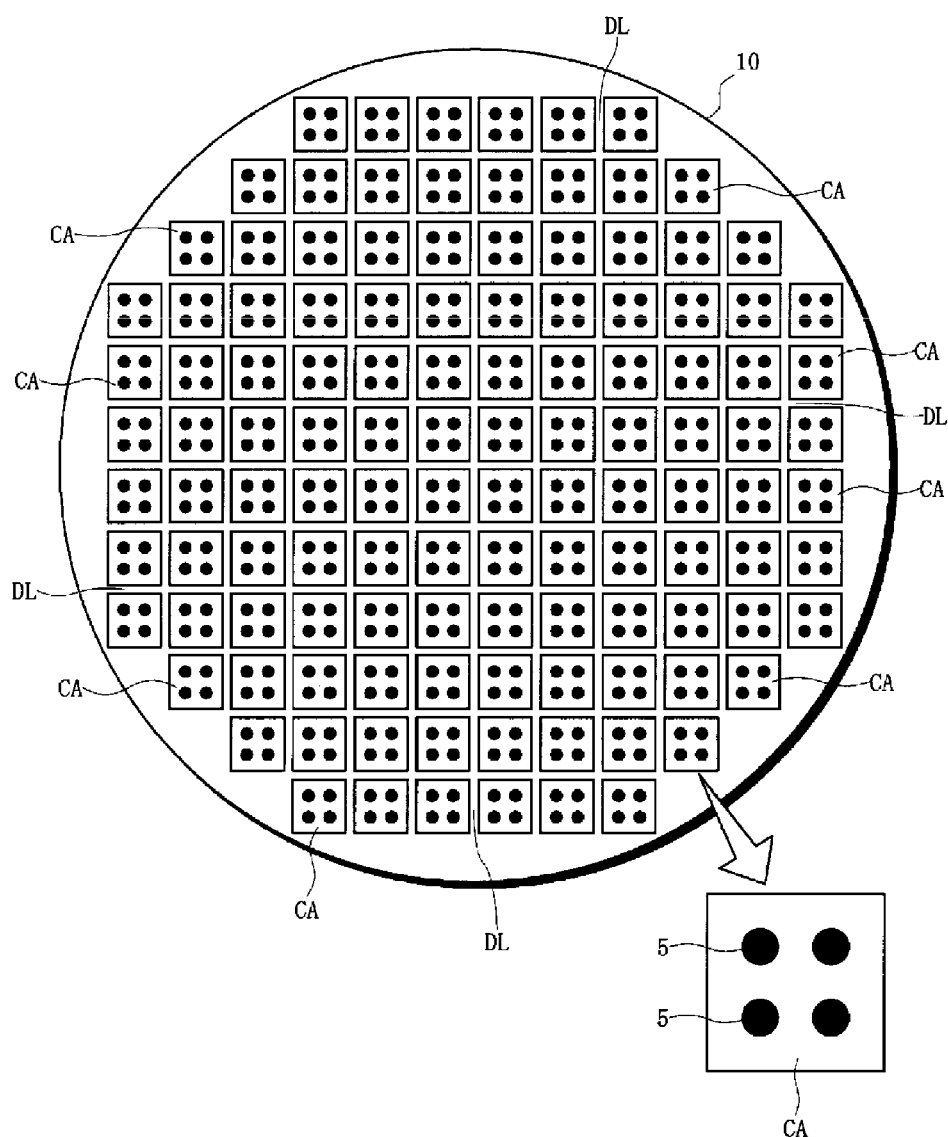
FIG. 7 is a plan view of essential parts of a semiconductor wafer during a manufacturing process for explaining the method of manufacturing the semiconductor device according to the first embodiment of the present invention.
Figure 8:
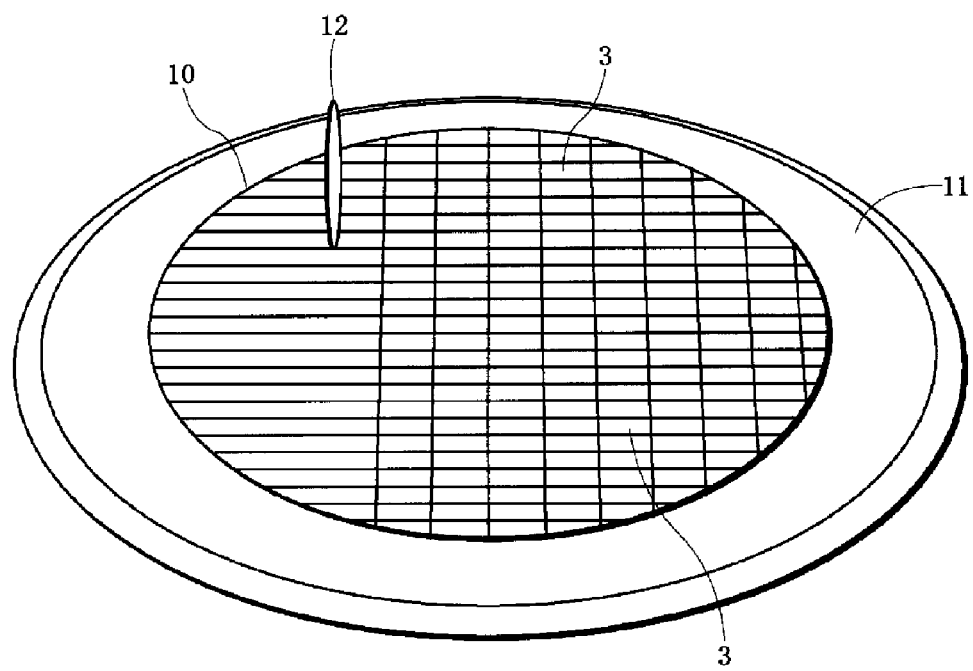
FIG. 8 is a plan view of essential parts of the semiconductor wafer during the manufacturing process for explaining the method of manufacturing the semiconductor device according to the first embodiment of the present invention (explanatory diagram following FIG. 7).
Figure 9A:
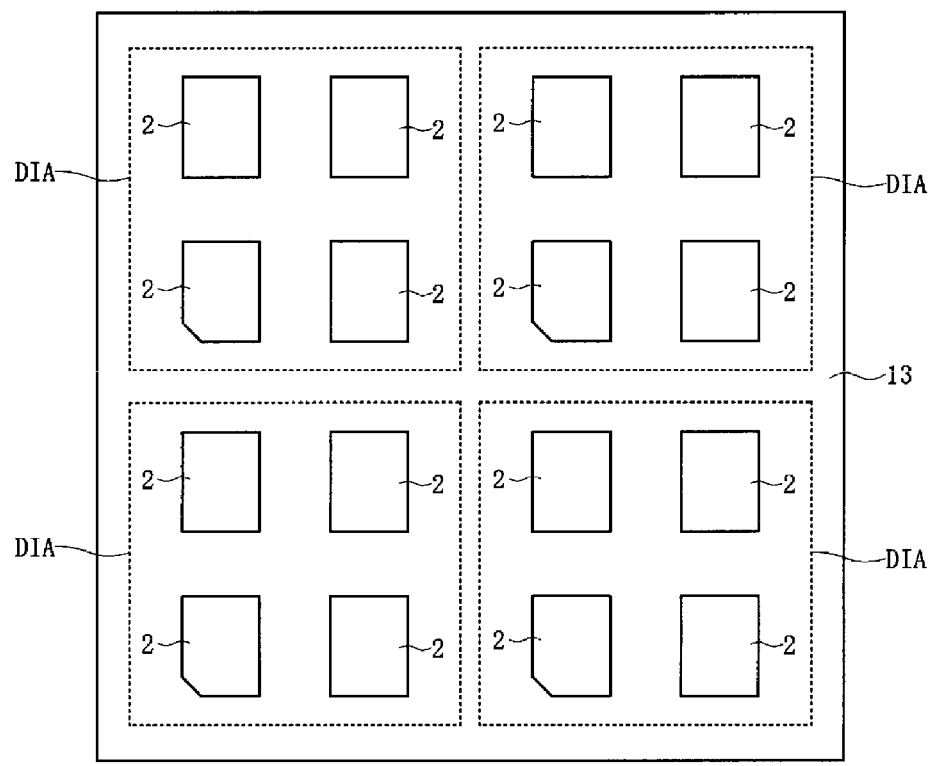
Figure 9B:
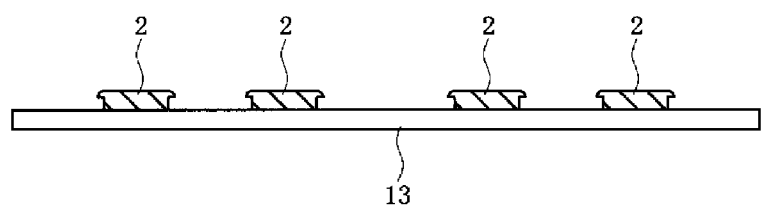
Figure 10:
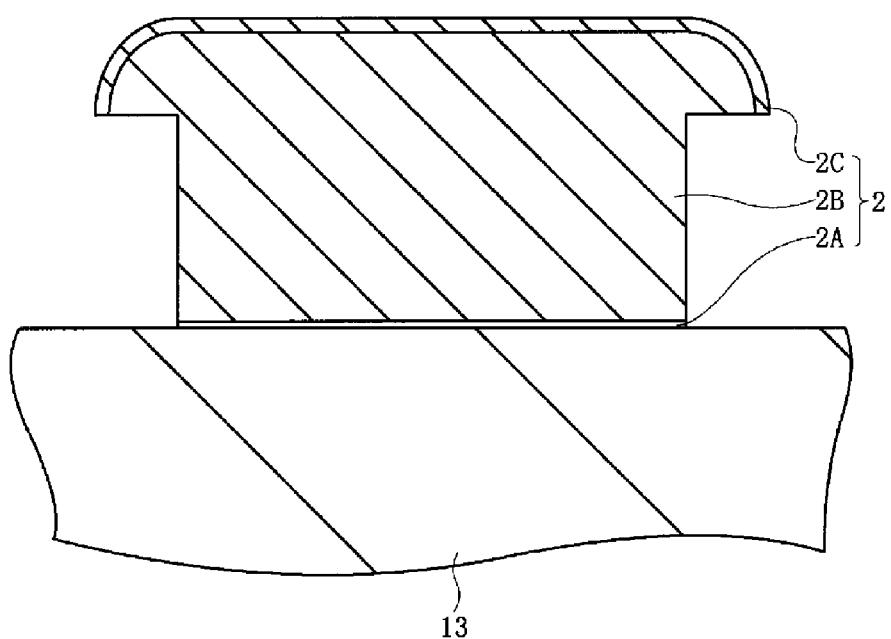
FIG. 10 is a sectional view of essential parts of a lead showing an enlarged view of one lead according to the first embodiment of the present invention.
Figure 11:
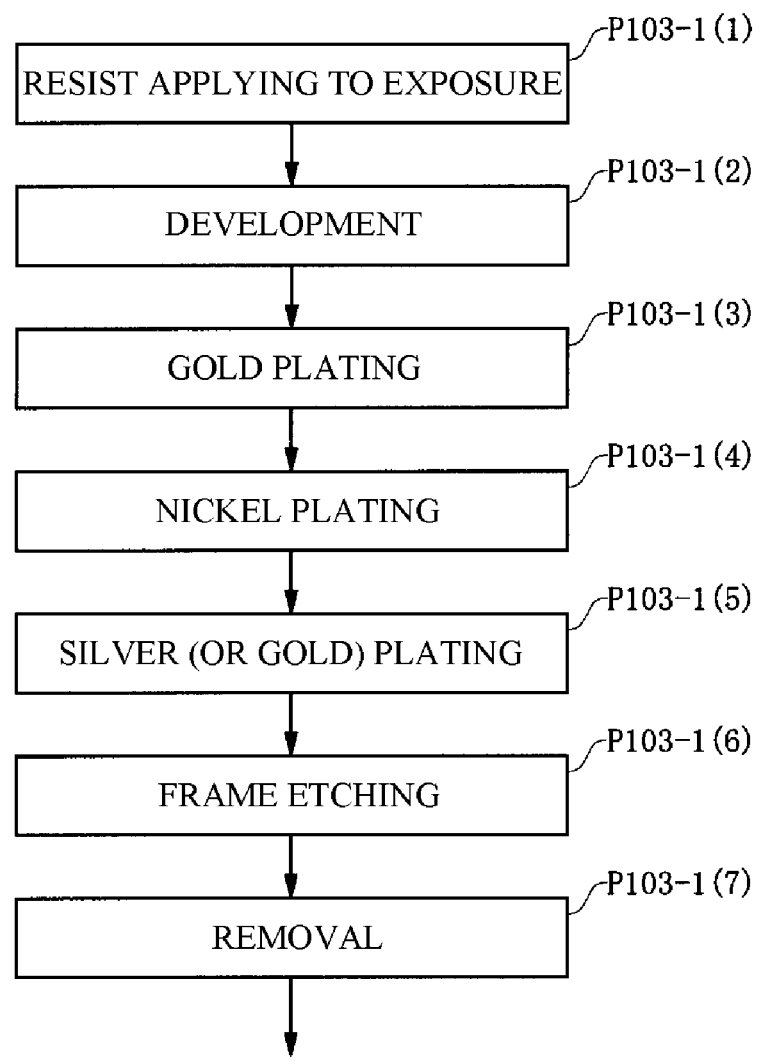
FIG. 11 is a process chart for explaining a method of manufacturing a substrate having a plurality of leads according to the first embodiment of the present invention.
Figure 19:
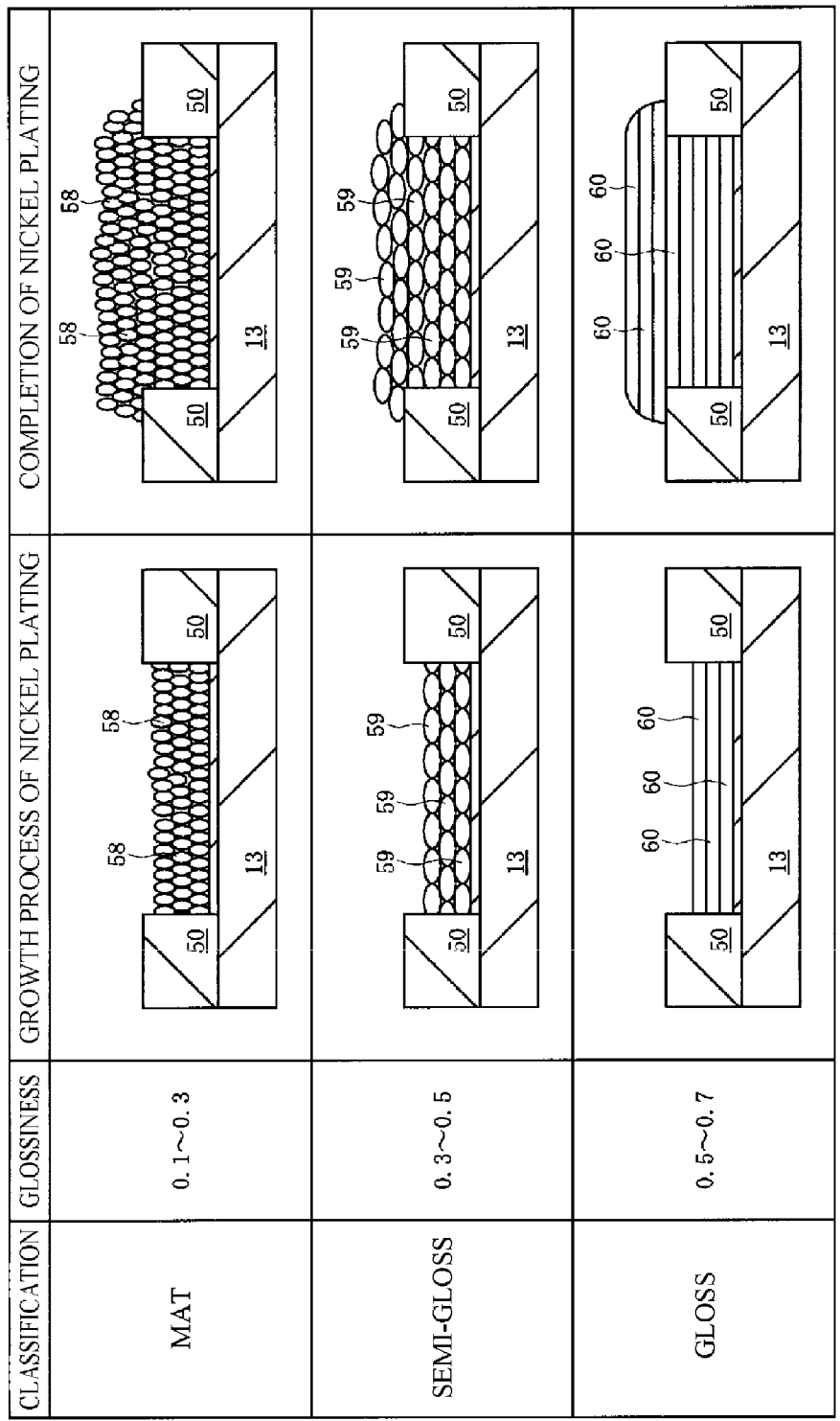
FIG. 19 is a schematic diagram for explaining a relationship between the growth direction of nickel particles and the amount of additive included in a nickel plating solution according to the first embodiment of the present invention.
Figure 20A:
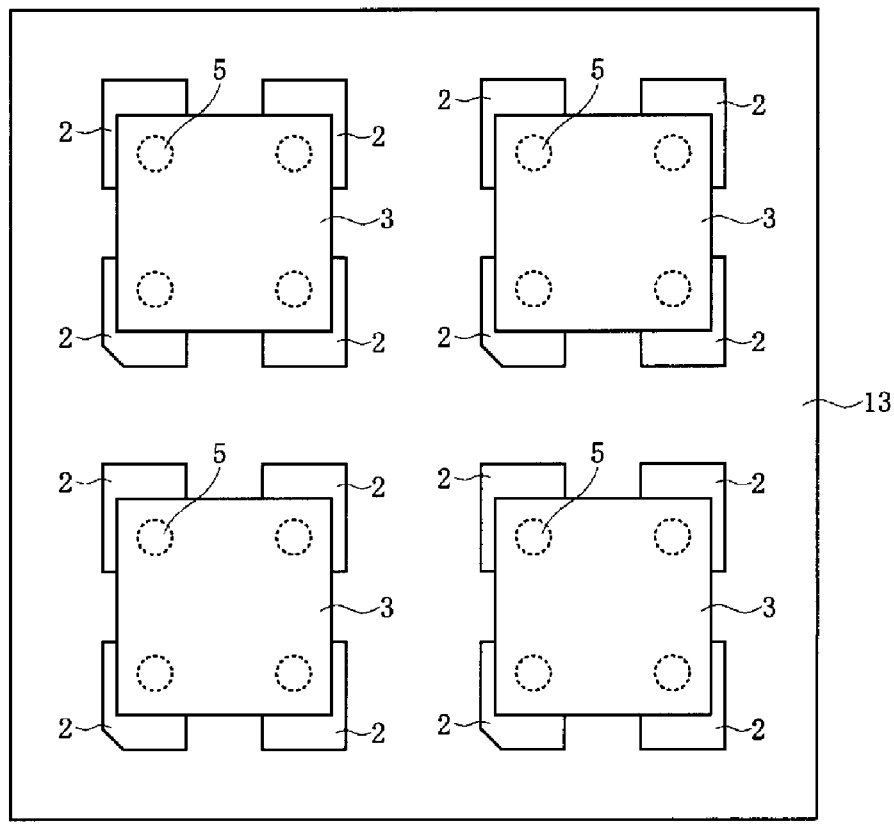
FIGS. 20($a$) and 20($b$) are explanatory diagrams during the manufacturing process for explaining the method of manufacturing the semiconductor device according to the first embodiment of the present invention (explanatory diagrams following FIGS. 9($a$) and 9($b$)), in which FIG. 20($a$) is a plan view of essential parts of the semiconductor device and FIG. 20($b$) is a sectional view of essential parts of the semiconductor device.
Figure 20B:
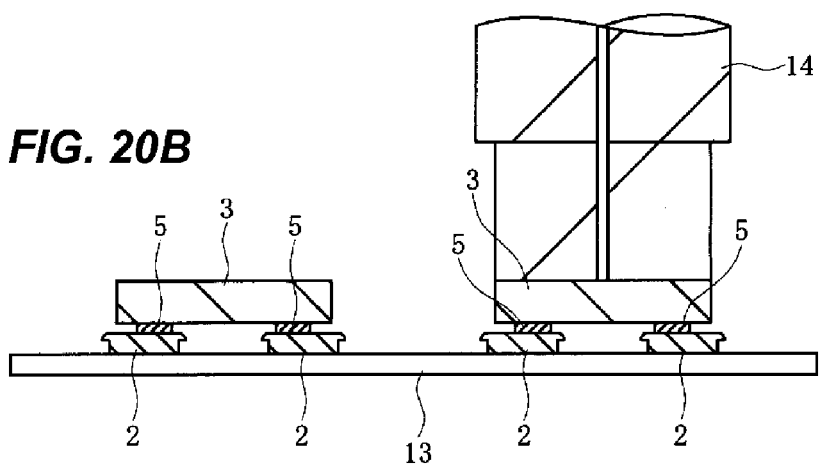
Figure 21:
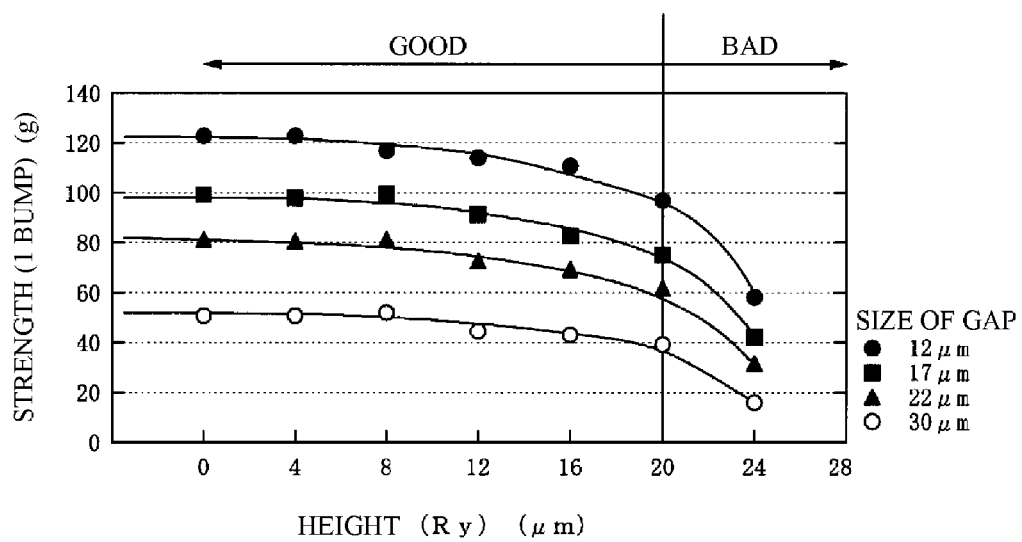
FIG. 21 is a graph showing a relationship between the joint strength of the lead and the bump electrode and the maximum height (Ry) of the roughness of the upper surface of the lead according to the first embodiment of the present invention.
Figure 22:
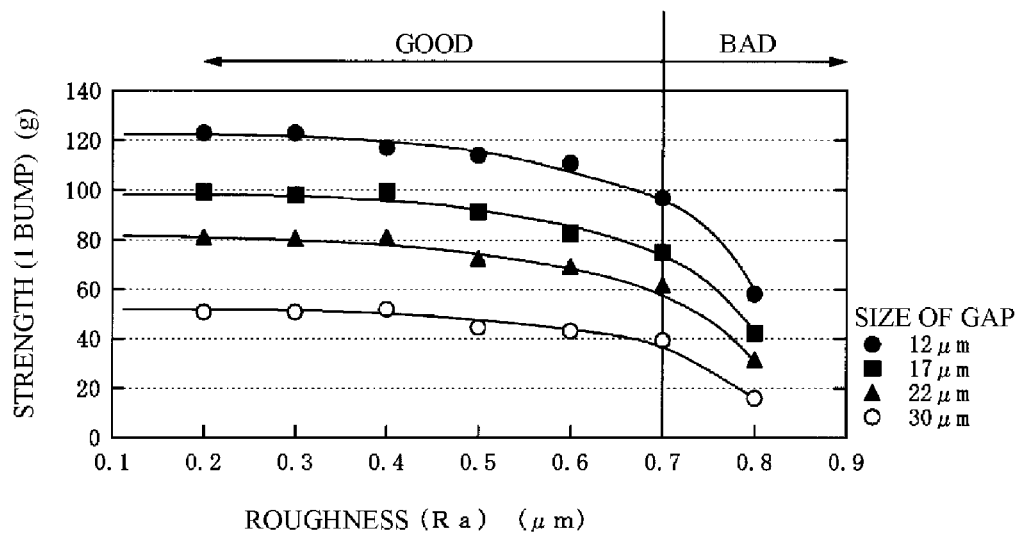
FIG. 22 is a graph showing a relationship between the joint strength of the lead and the bump electrode and the arithmetic mean roughness (Ra) of the roughness of the upper surface of the lead according to the first embodiment of the present invention.

Next, a method of manufacturing a semiconductor device having a 4-pin external terminal according to the first embodiment is explained in order of process using FIG. 6 to FIG. 27(b). FIG. 6 is a process chart for explaining the method of manufacturing the semiconductor device. FIG. 7 and FIG. 8 are plan views of essential parts of a semiconductor wafer during a manufacturing process for explaining the method of manufacturing the semiconductor device. FIGS. 9(a) and 9(b) are a plan view of essential parts and a sectional view of these parts, respectively, of the semiconductor device during the manufacturing process for explaining the method of manufacturing the semiconductor device. FIG. 10 is a sectional view of essential parts of a lead showing an enlarged view of one lead. FIG. 11 is a process chart for explaining a method of manufacturing a substrate having a plurality of leads. FIG. 12 to FIG. 18 are sectional views of essential parts of the substrate during a manufacturing process for explaining the method of manufacturing a substrate having the leads. FIG. 19 is a schematic diagram for explaining a relationship between the growth direction of nickel particles and the amount of additive contained in a nickel plating solution. FIGS. 20(a) and 20(b) are a plan view of essential parts and a sectional view of these parts, respectively, of the semiconductor device during the manufacturing process for explaining the method of manufacturing the semiconductor device. FIG. 21 is a graph showing a relationship between the joint strength of the lead and the bump electrode and the maximum height (Ry) of the roughness of the upper surface of the lead. FIG. 22 is a graph showing a relationship between the joint strength of the lead and the bump electrode and the arithmetic mean roughness (Ra) of the roughness of the upper surface of the lead. FIGS. 23(a) and 23(b) are a schematic diagram of the joint for explaining joining of the lead having a rough upper surface and the bump electrode and a schematic diagram of the joint for explaining joining of the lead having a comparatively planar upper surface and the bump electrode, respectively. FIG. 24(a) to FIG. 27(a) and FIG. 24(b) to FIG. 27(b) are plan views of essential parts and sectional views of these parts, respectively, of the semiconductor device during the manufacturing process for explaining the method of manufacturing the semiconductor device.

A method of manufacturing a semiconductor device having a 4-pin external terminal is explained. The method is not limited to the above and it is also possible to apply the method to a method of manufacturing a semiconductor device including a 6-pin or 9-pin external terminal.

(P101: Stud Bump Bonding)

First, as shown in FIG. 7, a semiconductor wafer 10 is provided. The semiconductor wafer 10 has single crystal silicon, a diameter of 200 mm or 300 mm, and a thickness of 0.7 mm or more (values when put into the manufacturing process). The semiconductor wafer 10 has a front surface (main surface), a plurality of chip areas CA partitioned and formed into the shape of a matrix on the front surface, a scribe area (dicing line) DL formed between the chip areas CA, and aback surface which is opposite to the front surface.

In each chip area CA on the front surface of the semiconductor wafer 10, an integrated circuit including a plurality of semiconductor elements, a multilayer wiring layer in which a plurality of insulating layers and a plurality of wiring layers are stacked, and a surface protective film formed to cover the multilayer wiring layer, although not limited to this, is formed. The insulating layer is formed by a silicon oxide film. The wiring layer is formed by a metal film such as aluminum (Al), tungsten (W), and copper (Cu). The surface protective film, such as the surface protective film shown by reference numeral 6 in FIG. 2 to FIG. 4, is formed by a multilayer film in which an inorganic insulating film, such as a silicon oxide film and a silicon nitride film, and an organic insulating film are stacked. In each chip area CA on the front surface of the semiconductor wafer 10, a plurality of bonding pads (electrode pad, surface electrode) electrically connected to the semiconductor elements, such as, the bonding pads 4 shown in FIG. 4, are disposed and these bonding pads include the wire in the uppermost layer of the multilayer wiring layer and are exposed from the openings formed in correspondence to the bonding pads in the surface protective film.

Next, by grinding the back surface of the semiconductor wafer 10 using a grinding material, the thickness of the semiconductor. wafer 10 is reduced to a predetermined one, such as about 0.13 mm.

(P102: Wafer Dicing Process)

Next, as shown in FIG. 8, an annular frame 11 to which a dicing tape is applied in advance is provided and onto the upper surface of the dicing tape, the semiconductor wafer 10 is pasted with its circuit formation surface facing upward. Next, the semiconductor wafer 10 is cut longitudinally and transversely along the scribe area DL using a very thin circular blade (dicing blade) 12 to which fine diamond particles are applied. The semiconductor wafer 10 is singulated into the individual semiconductor chips 3. The semiconductor chips 3 are fixed on the frame 11 via the dicing tape after singulation. Therefore, an aligned state is kept.

Next, by irradiating ultraviolet beams from the side of the lower surface of the dicing tape to reduce the adhesive force of the adhesive layer, each semiconductor chip 3 becomes likely to be peeled off from the dicing tape.

(P103: Flip Chip Bonding Process) (P103-1: Substrate Provision Process)

Next, as shown in FIGS. 9(a) and 9(b), a substrate (metal plate, stainless substrate, base substrate) 13 is provided. The substrate 13 includes an electrically conductive member, such as stainless (SUS 403) and copper, and is a multiple-piece substrate on which an area (chip mount area DIA) in which one semiconductor chip 3 is mounted is partitioned and formed into the shape of a matrix. FIGS. 9(a) and 9(b) illustrate the substrate 13 on which the four chip mount areas DIA are formed. The thickness of the substrate 13 is, for example, about 0.15 mm. In each of the chip mount areas DIA on the upper surface (front surface) of the substrate 13, the four leads (terminal, metal plate, electrically conductive pattern) 2, which are external terminals, are formed.

As shown in FIG. 10, the lead 2 includes a laminated film in which a gold (Au) film 2A, a nickel (Ni) film 2B, and a silver (Ag) film 2C (or gold film) are formed sequentially from the bottom by the electrolytic plating method, and has the shape of a mushroom having a protruding part in which the nickel film 2B bulges out in the shape of eaves. The upper surface (surface) of the lead 2 is in a position higher than that of the substrate 13, but, it is possible to form the lead 2 formed by the electrolytic plating method to have a thickness half or less that of the lead including part of the lead frame formed by patterning an electrically conductive substrate (metal plate). Further, by forming the lead 2 into the shape of a mushroom, the anchor effect of the lead 2 can be expected in the resin mold process (P104), which is a subsequent manufacturing process. The thickness of the gold film 2A forming the lead 2 is 0.03 μm, that of the nickel film 2B is 60 μm, and that of the silver film 2C (or gold film) is 3 μm.

Next, the shape of the lead 2 is explained in detail.

First, a method of manufacturing the substrate 13 in which the leads 2 are formed is explained using FIG. 11 to FIG. 18. FIG. 11 is a process chart for explaining a method of manufacturing a substrate having a plurality of leads and FIG. 12 to FIG. 18 are sectional views of essential parts of the substrate during a manufacturing process for explaining the method of manufacturing the substrate having the leads.

(P103-1 (1): Resist Applying Process to Exposure Process)

Figure 12:
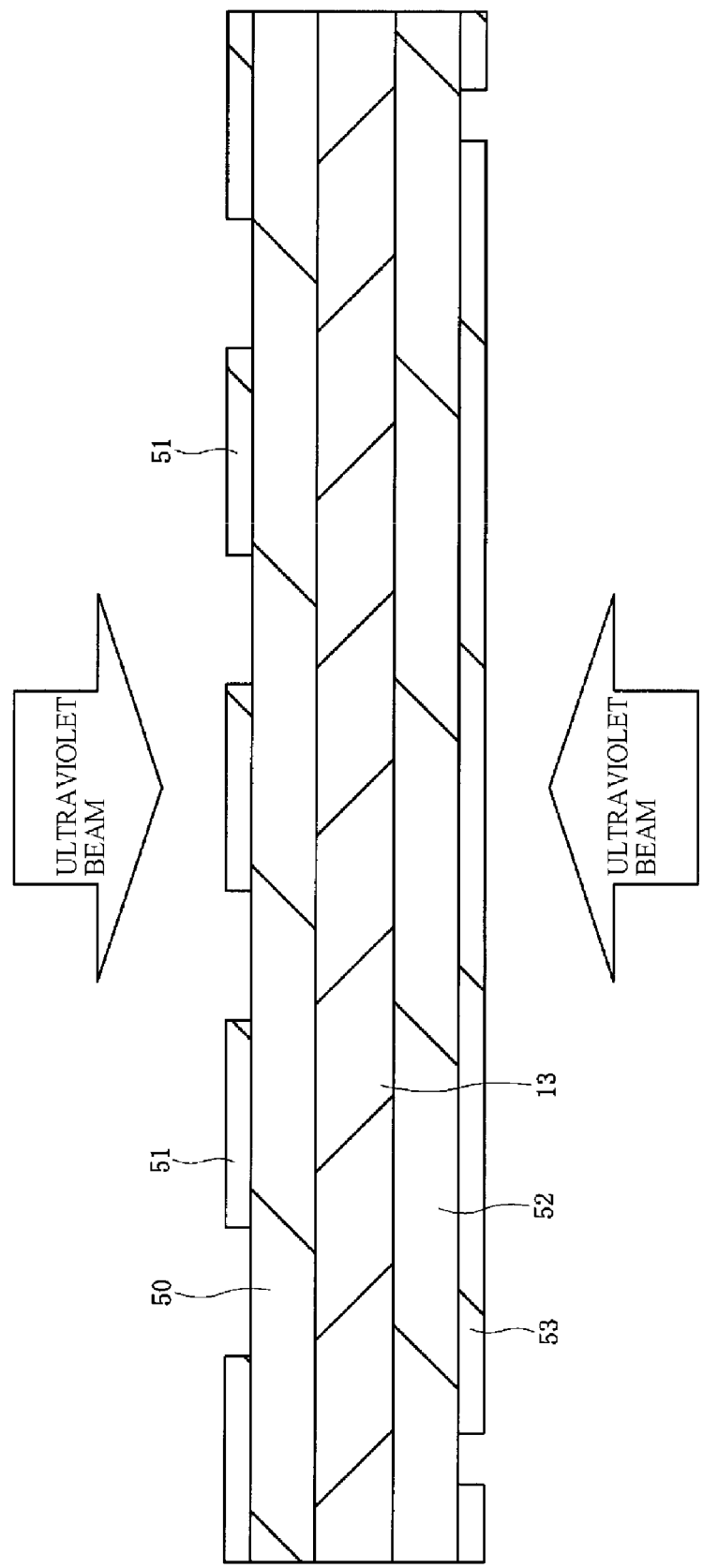
FIG. 12 is a sectional view of essential parts of the substrate during a manufacturing process for explaining the method of manufacturing the substrate having the leads according to the first embodiment of the present invention.

As shown in FIG. 12, after applying a resist film 50 to the upper surface of the substrate 13, the resist film 50 is exposed to ultraviolet beams via a film mask 51 in which a predetermined pattern is formed. Similarly, after applying a resist film 52 to the lower surface (back surface) opposite to the upper surface of the substrate 13, the resist film 52 is exposed to ultraviolet beams via a film mask 53 in which a predetermined pattern is formed.

(P103-1 (2): Development Process)

Figure 13:
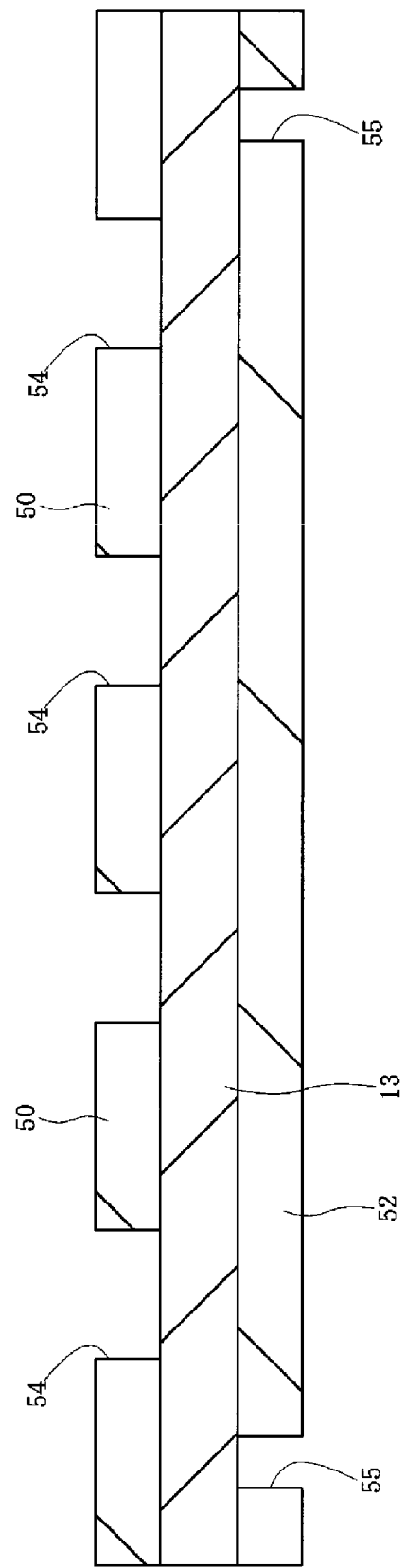
FIG. 13 is a sectional view of essential parts of the substrate during the manufacturing process for explaining the method of manufacturing the substrate having the leads according to the first embodiment of the present invention (sectional view of essential parts of the same portion as that in FIG. 12, following FIG. 12).

As shown in FIG. 13, after removing the film masks 51, 53, the resist film 50 applied to the upper surface of the substrate 13 and the resist film 52 applied to the lower surface of the substrate 13 are patterned, respectively, by performing development processing. In this manner, holes 54 for a plurality of leads to form the leads 2 are formed in the resist film 50 applied to the upper surface of the substrate 13 and holes 55 for a plurality of guides are formed in the resist film 52 applied to the lower surface of the substrate 13.

(P103-1 (3): Gold Plating Process)

Figure 14:
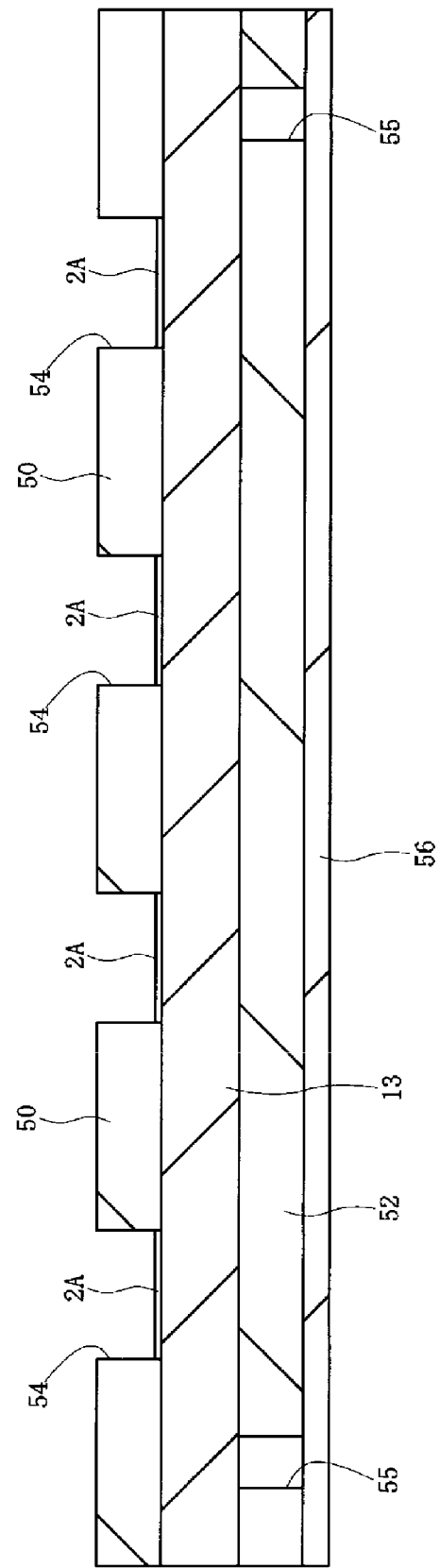
FIG. 14 is a sectional view of essential parts of the substrate during the manufacturing process for explaining the method of manufacturing the substrate having the leads according to the first embodiment of the present invention (section view of essential parts of the same portion as that in FIG. 12, following FIG. 13).

As shown in FIG. 14, after covering the surface of the resist film 52 formed on the lower surface of the substrate 13 with a protective film 56, the gold film 2A is formed (deposited) at each of the bottoms of the holes 54 for the leads formed in the upper surface of the substrate 13 by the electrolytic plating method. The thickness of the gold film 2A is 0.03 µm.

(P103-1 (4): Nickel Plating Process)

Figure 15:
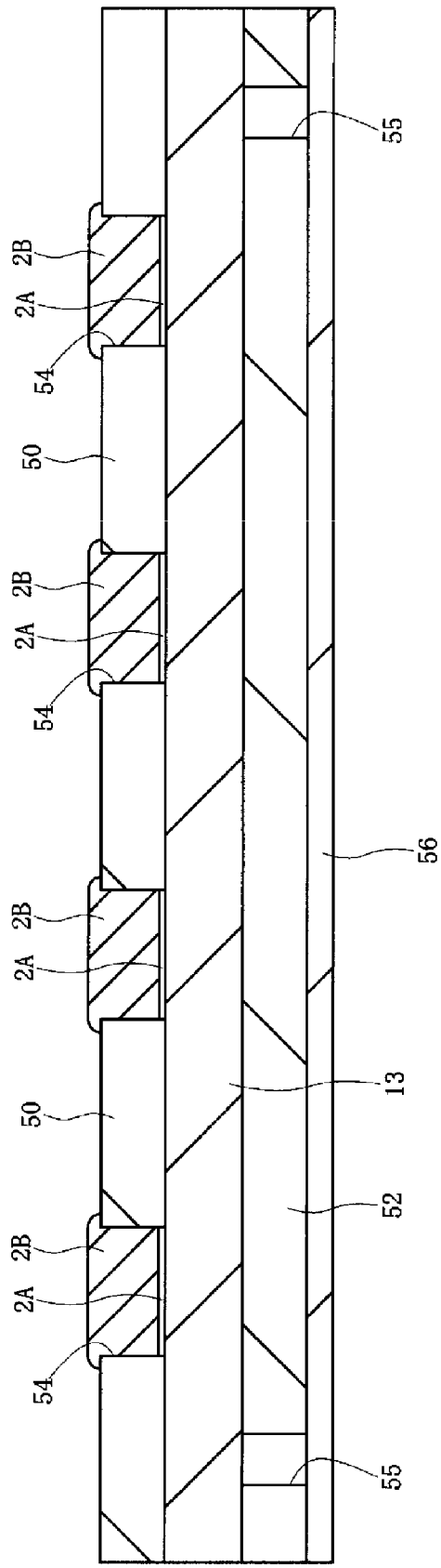
FIG. 15 is a sectional view of essential parts of the substrate during the manufacturing process for explaining the method of manufacturing the substrate having the leads according to the first embodiment of the present invention (section view of essential parts of the same portion as that in FIG. 12, following FIG. 14).

As shown in FIG. 15, the nickel films 2B are further formed (deposited), respectively, in the state of being coupled to the gold film 2A inside of the holes 54 for the leads formed in the upper surface of the substrate 13 by the electrolytic plating method. The nickel film 2B is formed spread on the surface of the resist film 51 as well as inside of the holes 54 for the leads, and therefore, formed into the shape of a mushroom having an overhang (portion bulging out like eaves). The thickness of the nickel film 2B is 60 µm.

(P103-1 (5): Silver (or Gold) Plating Process)

Figure 16:
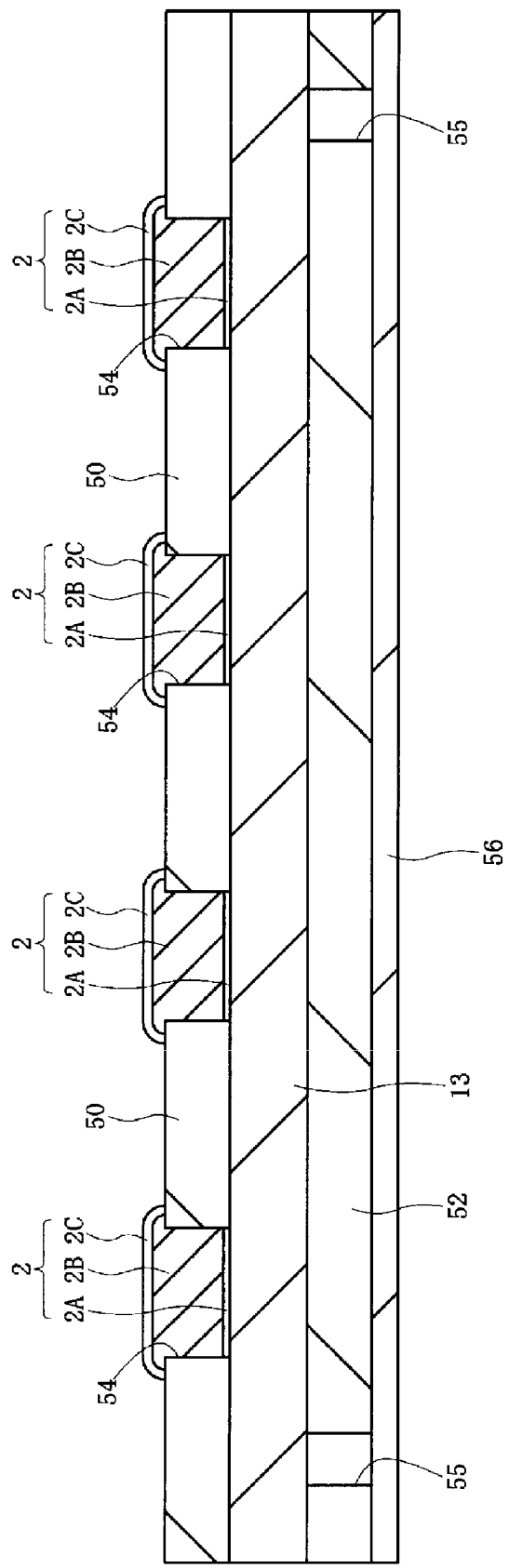
FIG. 16 is a sectional view of essential parts of the substrate during the manufacturing process for explaining the method of manufacturing the substrate having the leads according to the first embodiment of the present invention (sectional view of essential parts of the same portion as that in FIG. 12, following FIG. 15).

As shown in FIG. 16, the silver films 2C (or gold film) is further formed (deposited) in the state of being connected to the nickel film 2B on the surface of the nickel films 2B formed on the upper surface of the substrate 13 by the electrolytic plating method. The thickness of the silver film 2C (or gold film) is 3 µm. In the present first embodiment, formation of the gold film 2A, the nickel film 2B, and the silver film 2C (or gold film) by the electrolytic plating method is explained. They may be formed by the electroless plating method. If the forming speed (deposition speed) of these plated films is taken into consideration, it is preferable to use the electrolytic plating method.

(P103-1 (6): Frame Etching Process)

Figure 17:
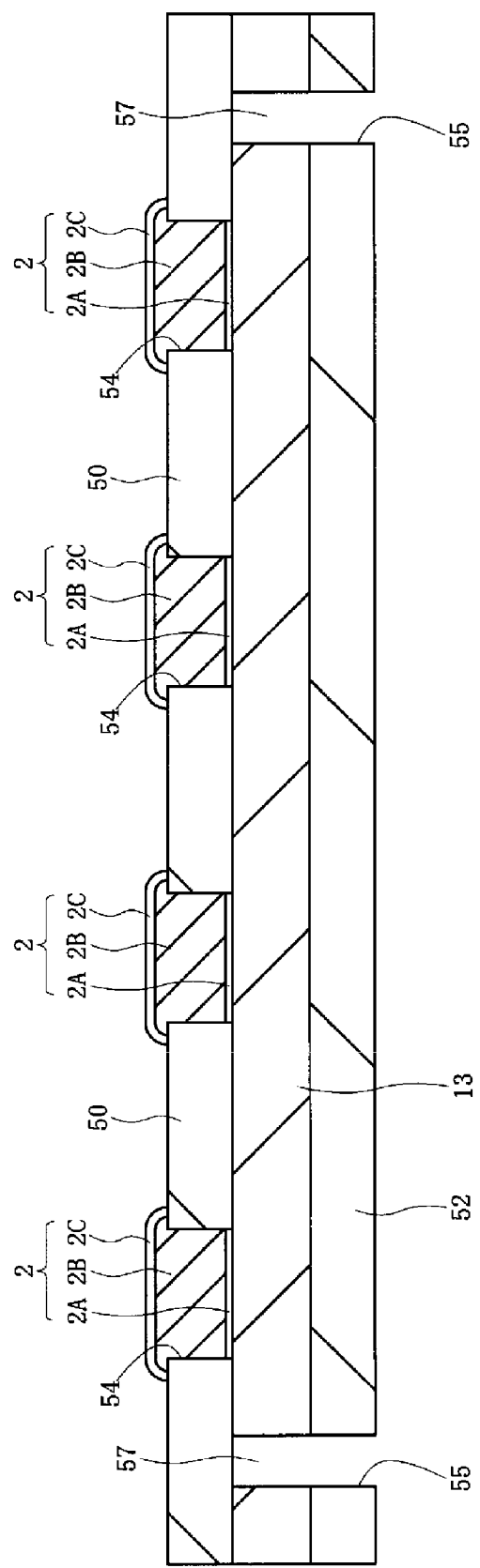
FIG. 17 is a sectional view of essential parts of the substrate during the manufacturing process for explaining the method of manufacturing the substrate having the leads according to the first embodiment of the present invention (sectional view of essential parts of the same portion as that in FIG. 12, following FIG. 16).

As shown in FIG. 17, after removing the protective film 56 that covers the surface of the resist film 52 formed on the lower surface of the substrate 13, the substrate 13 is etched using the resist film 52 as a mask. Then, an outer frame 57 of the substrate 13 is formed in correspondence to the hole 55 for guide formed in the resist film 52.

(P103-1 (7): Removal Process)

Figure 18:
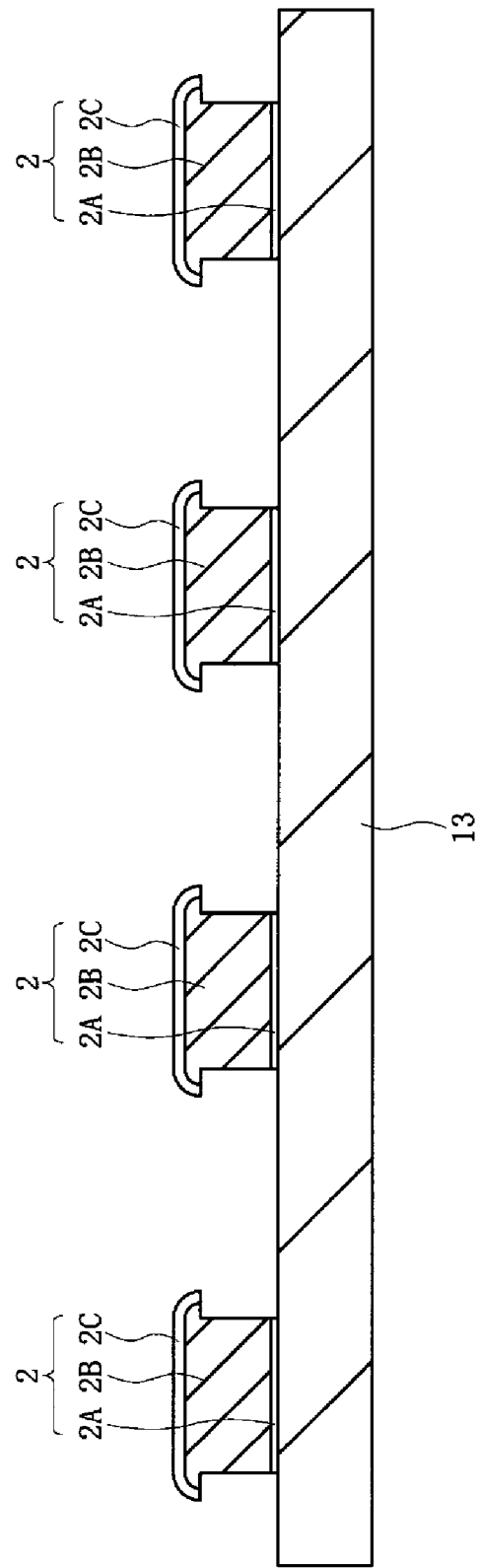
FIG. 18 is a sectional view of essential parts of the substrate during the manufacturing process for explaining the method of manufacturing the substrate having the leads according to the first embodiment of the present invention (sectional view of essential parts of the same portion as that in FIG. 12, following FIG. 17).

As shown in FIG. 18, by removing the resist films 50, 52 and removing part of the excess substrate 13, the substrate 13 having the leads 12 is almost completed.

In the nickel plating process (P103-1 (4)), the nickel film 2B is formed such that the roughness of the front surface is within the predetermined range (0 µm<maximum height (Ry)≤20 µm, 0 µm<arithmetic mean roughness (Ra)≤0.7 µm). Specifically, by putting a trace of additive, such as sulfur (S) and carbon (C), into the nickel plating solution, the growth direction of the nickel particles is changed from the direction perpendicular to the upper surface of the substrate 13 to the horizontal direction.

A relationship between the nickel particle growth direction and the amount of additive contained in the nickel plating solution is explained using the schematic diagram shown in FIG. 19.

When a nickel plating solution containing no additive is used, the nickel particles grow granularly in the vertical direction (longitudinal direction) with respect to the upper surface of the substrate 13 and longitudinal granular nickel 58 stacks up to form a nickel film. Because the size of the longitudinal granular nickel 58 is not uniform, the surface of the nickel film that is formed becomes rough gradually and has the projecting shape. Because the surface of the nickel film is rough, the nickel film is mat (glossiness is about 0.1 to 0.3). Because no additive is contained, it is possible to form a nickel film at low cost. However, when the lead 2 including the nickel film and the bump electrode (bump, metal bump, projecting electrode) 5 are joined in the subsequent die bonding process (P103-2), a joint failure tends to occur, in which the bump electrode 5 peels off from the upper surface of the lead 2. Because of this, it is difficult to apply the nickel film including the longitudinal granular nickel 58 as the nickel film 2B forming the lead 2.

When a nickel plating solution containing an additive is used, the nickel particles grow granularly in the horizontal direction (transverse direction) with respect to the upper surface of the substrate 13 and transverse granular nickel 59 stacks up mainly to form a nickel film (longitudinal granular nickel or transverse layered nickel may be contained partially). The size of the transverse granular nickel 59 is not uniform, but, the surface of the nickel film that is formed is planarized more than the surface of the nickel film containing the longitudinal granular nickel 58 formed by the nickel plating solution containing no additive. The surface of the nickel film becomes comparatively planarized, and therefore, the nickel film becomes semi-glossy (glossiness is about 0.3 to 0.5).

When a nickel plating solution containing a larger amount of additive is used, the nickel particles grow in a layer in the horizontal direction (transverse direction) with respect to the upper surface of the substrate 13 and transverse layered nickel 60 stacks up to form a nickel film. Because the transverse layered nickel 60 grows in a layer, the surface of the formed nickel film is planarized. The surface of the nickel film is planarized, and then, the nickel film becomes glossy (glossiness is about 0.5 to 0.7). However, the nickel film containing the transverse layered nickel 60 becomes brittle at a high temperature (the temperature is 300° C. in the present first embodiment, but a temperature of about 250° C. should be taken into account when the period of time during which it is exposed to a high temperature state is long). Therefore, it is difficult to apply this nickel film as the nickel film 2B forming the lead 2.

Consequently, the nickel film 2B forming the lead 2 includes a semi-glossy nickel-plated film between mat one and glossy one, not the mat nickel-plated film the surface of which is rough or the glossy nickel-plated film the surface of which is planarized. The roughness of the surface of the nickel film 2B is such that the maximum height (Ry) is in the range greater than 0 µm and not greater than 20 µm and the arithmetic mean roughness (Ra) is in the range greater than 0 µm and not greater than 0.7 µm.

Actually, on the surface of the nickel film 2B, the silver film 2C (or gold film) is formed by the electrolytic plating method and the lead 2 including the gold film 2A, the nickel film 2B, and the silver film 2C (or gold film) is formed. However, because the thickness of the silver film 2C (or gold film) is 3 µm, on the upper surface of the lead (surface of the silver film 2C (or gold film)), the roughness and semi-gloss reflecting the state of the surface of the nickel film 2B appear.

(P103-2: Die Boding Process)

Next, after peeling off the semiconductor chip 3 from the dicing tape and picking up the semiconductor chip 3, its front surface and back surface are reversed. Subsequently, after adsorbing and holding the back surface of the semiconductor chip 3 with a collet 14, the semiconductor chip 3 is conveyed to a predetermined chip mount area of the upper surface of the substrate 13. The collet 14 has a rectangular external shape and the material includes carbide.

Next, the bump electrodes 5 formed on the front surface (main surface) of the semiconductor chip 3 and the leads 2 formed on the upper surface of the substrate 13 are caused to oppose each other and by applying heat, load, and ultrasonic wave, and then, the leads 2 and the bump electrodes 5 are joined. The bump electrode 5 is moved (vibrated) in the horizontal direction (direction of the plane parallel to the upper surface of the lead 2) and rubbed against the upper surface of the lead 2. Then, the lead 2 and the bump electrode 5 are joined. The temperature of heat at the time of joining is 100 to 250° C. (typically, 200° C.), the load of the collet 14 is 150 to 800 g (typically, 400 g), and the output of the ultrasonic wave is 0.72 A.

The joint strength of the lead 2 and the bump electrode 5 depends on the bonding conditions, such as the temperature of heat, the load of the collet 14, and the output of the ultrasonic wave. This joint strength depends on the roughness of the upper surface of the lead 2.

FIG. 21 shows the relationship between the joint strength of the lead per bump electrode and the bump electrode and the maximum height (Ry) of the roughness of the upper surface of the lead. Each parameter is the distance between the surface protective film 6 formed on the front surface of the semiconductor chip 3 and the upper surface of the lead 2 (the size of gap shown in FIG. 4). As shown in FIG. 21, the joint strength reduces gradually as the maximum height (Ry) increases for each parameter. Further, according to the discussion conducted by the inventors of the present application, when the size of gap is 30 μm, the joint failure tends to occur particularly in the bump the strength of which reduces below about 40 g (when the size of gap is 12 μm, in the bump the strength of which reduces below about 100 g). When the maximum height (Ry) of the roughness of the upper surface of the lead exceeds 20 μm, the joint strength reduces remarkably and many joint failures of the lead and the bump electrode occur. The lead the maximum height (Ry) of which exceeds 20 μm is mat in most cases.

FIG. 22 shows the relationship between the joint strength of the lead per bump electrode and the bump electrode and the arithmetic mean roughness (Ra) of the roughness of the upper surface of the lead. Each parameter is the distance between the surface protective film 6 formed on the front surface of the semiconductor chip 3 and the upper surface of the lead 2 (the size of gap shown in FIG. 4). As shown in FIG. 22, the joint strength reduces gradually as the arithmetic mean roughness (Ra) increases for each parameter. Further, according to the discussion conducted by the inventors of the present application, when the size of gap is 30 μm, the joint failure tends to occur particularly in the bump the strength of which reduces below about 40 g (when the size of gap is 12 μm, in the bump the strength of which reduces below about 100 g). When the arithmetic mean roughness (Ra) of the roughness of the upper surface of the lead exceeds 0.7 μm, the joint strength reduces remarkably and many joint failures of the lead and the bump electrode occur. The lead the arithmetic mean roughness (Ra) of which exceeds 0.7 μm is mat in most cases.

The phenomena shown in FIG. 21 and FIG. 22 are explained below using FIGS. 23(a) and (b).

As shown in FIG. 23(a), when the lead 2 having the rough upper surface (maximum height (Ry)>20 μm, arithmetic mean roughness (Ra)>0.7 μm) and the bump electrode 5 are joined, the bump electrode 5 catches in the protrusions of the upper surface of the lead 2 and the movement in the horizontal direction of the bump electrode 5 by the ultrasonic wave is blocked. Therefore, the ultrasonic wave does not reach the joint of the lead 2 and the bump electrode 5. As a result, the joint strength of the lead 2 and the bump electrode 5 reduces.

Because the bump electrode 5 is joined in advance to the bonding pad formed on the front surface of the semiconductor chip 3, the joint failure is hard to occur at the joint of the bonding pad and the bump electrode 5 compared to the joint of the lead 2 and the bump electrode 5.

When the lead 2 having the comparatively flat upper surface (0 μm<maximum height (Ry)≤20 μm, 0 μm<arithmetic mean roughness (Ra)≤0.7 μm) and the bump electrode 5 are joined, the protrusions of the upper surface of the lead 2 are small and it is unlikely that the movement in the horizontal direction of the bump electrode 5 by the ultrasonic wave is blocked. Therefore, the ultrasonic wave reaches the joint of the lead 2 and the bump electrode 5. As a result, the joint strength of the lead 2 and the bump electrode 5 increases.

According to the discussion conducted by the inventors of the present application, the higher the protrusions existing on the upper surface of the lead 2 becomes, the harder the bump electrode 5 becomes to move because the bump electrode 5 catches in the protrusions. Consequently, to smooth the movement of the bump electrode 5 in the horizontal direction by the ultrasonic wave, it is more important to reduce the maximum height (Ry) than to reduce the arithmetic mean roughness (Ra), of the roughness of the upper surface of the lead 2. It is preferable to form the lead 2 having a semi-glossy upper surface with a roughness the maximum height (Ry) of which is at least not greater than the limit value (20 μm shown in FIG. 21) by giving priority to reduction in the maximum height (Ry) over reduction in the arithmetic mean roughness (Ra) of the roughness of the upper surface of the lead 2.

As measures to improve (solve) the joint failure of the lead 2 and the bump electrode 5, the bump electrode 5 may be joined to the upper surface of the lead 2 more strongly by increasing the temperature of heat, the load of the collet 14, and the output of the ultrasonic wave. If the bonding conditions are changed as above, the bump electrode 5 may be crushed more than expected. Ordinarily, the diameter of the bump electrode 5 before joining is 70 to 80 μm. The bump electrode 5 after joining is crushed and the diameter will be 100 to 130 μm If the bump electrode 5 is crushed more than expected and the height of the bump electrode 5 becomes lower than a predetermined height, the distance between the surface protective film 6 of the front surface of the semiconductor chip 3 and the upper surface of the lead 2 becomes small. Then, when this distance becomes small, it becomes hard for the sealing resin to be supplied between the surface protective film 6 of the front surface of the semiconductor chip 3 and the upper surface of the lead 2 in the subsequent resin mold process (P104) and a mold failure is caused. Further, if the surface protective film 6 of the front surface of the semiconductor chip 3 contacts the upper surface of the lead 2, the surface protective film 6 may be destroyed. Because of this, the bonding conditions cannot be changed easily.

(P104: Resin Mold Process)

Figure 24A:
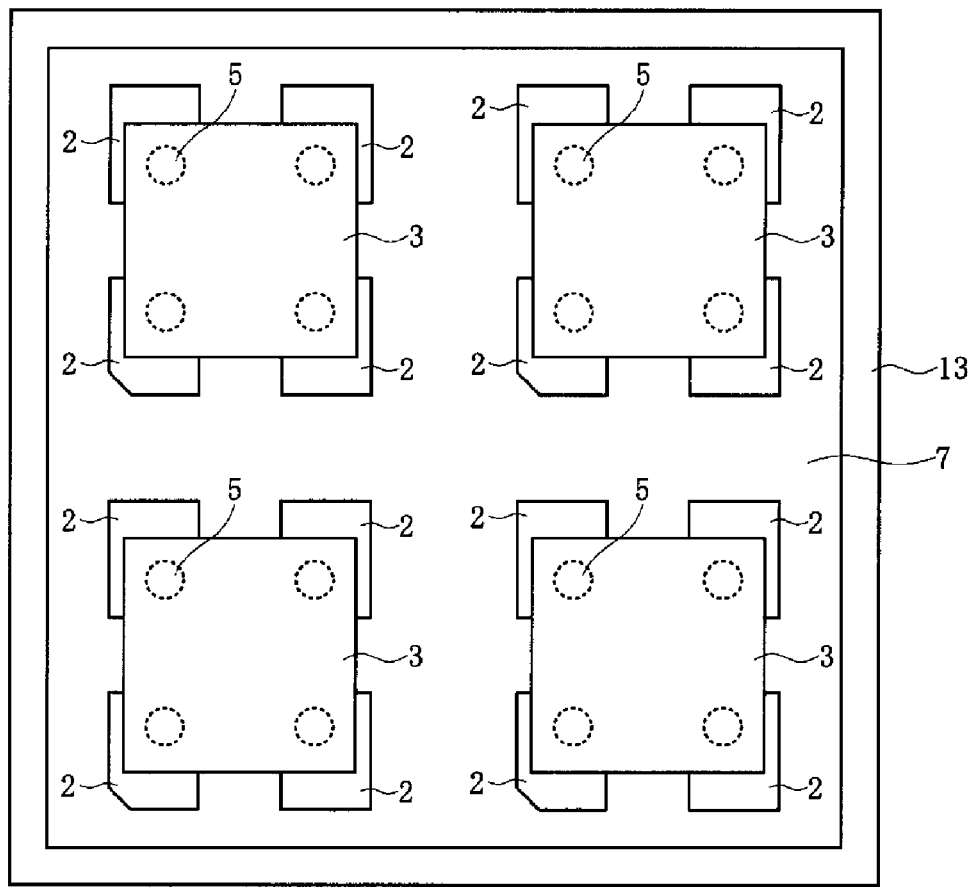
FIGS. 24($a$) and 24($b$) are explanatory diagrams during the manufacturing process for explaining the method of manufacturing the semiconductor device according to the first embodiment of the present invention (explanatory diagram following FIGS. 20($a$) and 20($b$)), in which FIG. 24($a$) is a plan view of essential parts of the semiconductor device and FIG. 24($b$) is a sectional view of essential parts of the semiconductor device.
Figure 24B:
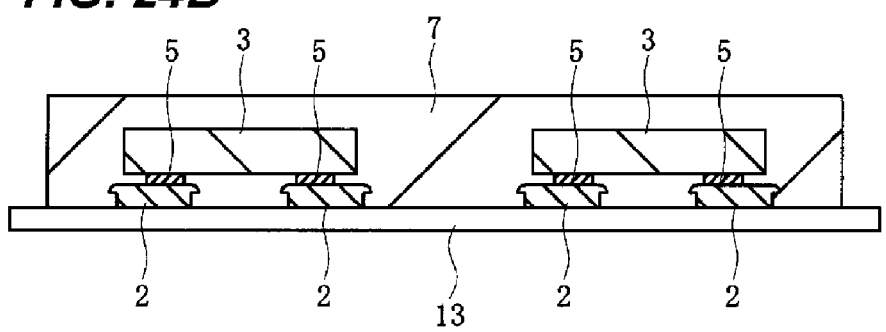

Next, as shown in FIGS. 24(a) and 24(b), the substrate 13 on which the semiconductor chips 3 are mounted is set in a die molding machine, a sealing resin turned into a liquid by raising temperature is pressurized and fed into the die molding machine, the side of the upper surface of the substrate 13 is sealed with the sealing resin, and thus, one resin sealing body (sealing body) 7 is formed. Subsequently, thermal treatment is performed at 170° C. Then, the upper surface of the substrate 13, the semiconductor chips 3, each part of the leads 2 (upper surface and side surface), and the bump electrodes 5 are sealed with the resin sealing body 7. The thickness of the resin sealing body 7 is 0.4 mm. To reduce stress, the resin sealing body 7 includes an epoxy-based thermosetting insulating resin added with a phenol-based curing agent, silicone rubber, and a number of fillers (silica).

(P105: Substrate Peeling Process)

Figure 25A:
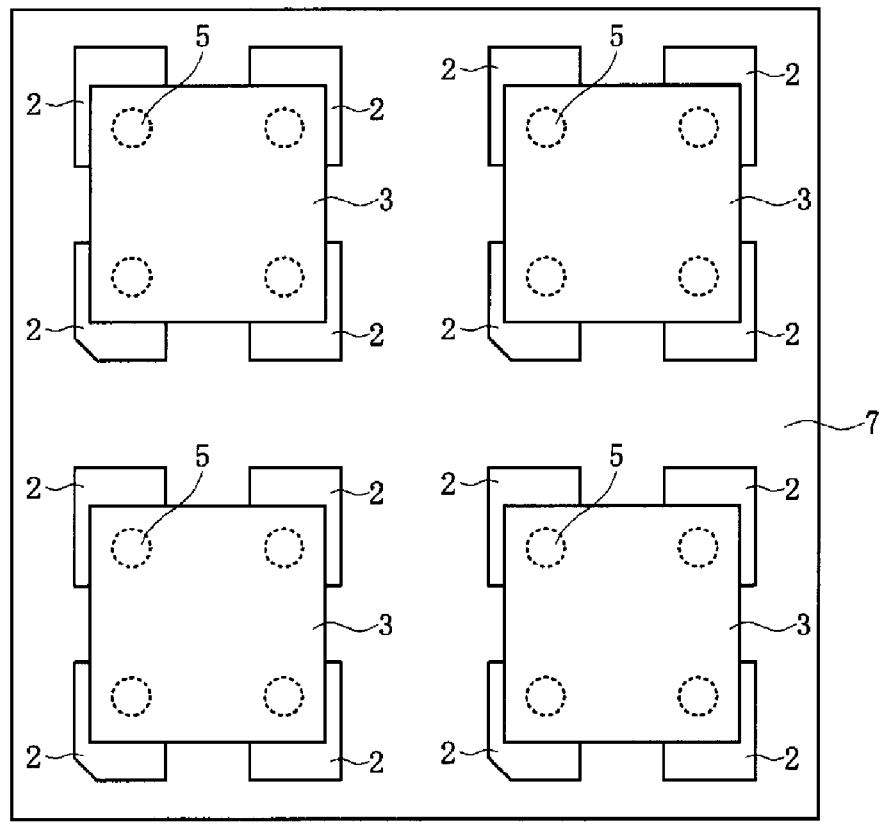
FIGS. 25($a$) and 25($b$) are explanatory diagrams during the manufacturing process for explaining the method of manufacturing the semiconductor device according to the first embodiment of the present invention (explanatory diagram following FIGS. 24($a$) and 24($b$)), in which FIG. 25($a$) is a plan view of essential parts of the semiconductor device and FIG. 25($b$) is a sectional view of essential parts of the semiconductor device.
Figure 25B:
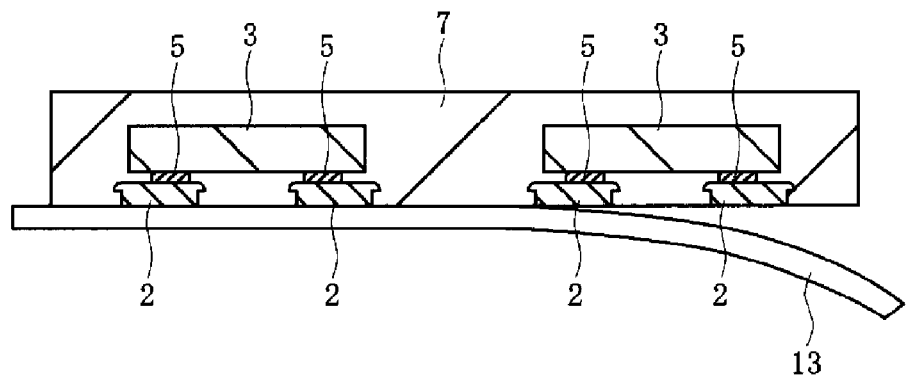

Next, as shown in FIGS. 25(a) and 25(b), the substrate 13 is peeled off from the resin sealing body 7. Then, from the lower surface (back surface) of the resin sealing body 7, other parts (lower surface, back surface, mounting surface) of the leads 2 are exposed.

(P106: Post Cure Bake Process)

Next, the resin sealing body 7 is subject to thermal treatment at 170 to 180° C. for about five hours.

(P107: Laser Mark Process)

Next, the product name etc. is stamped on the upper surface of the resin sealing body 7.

(P108: Package Dicing Process)

Figure 26A:
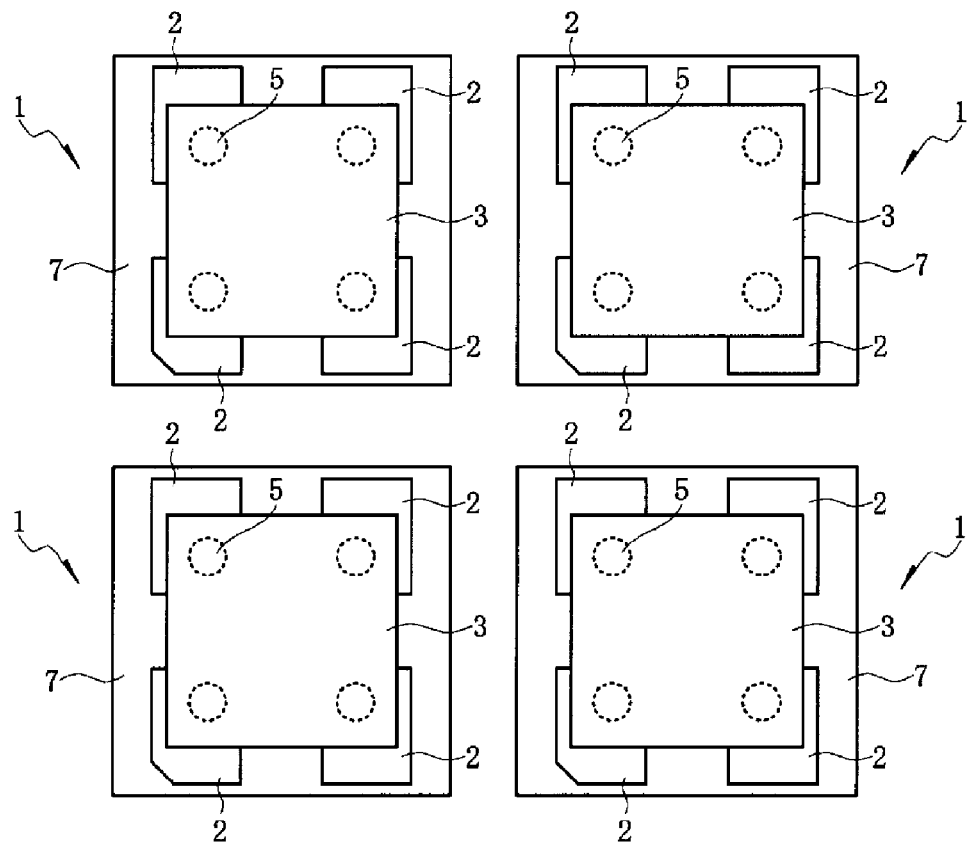
FIGS. 26($a$) and 26($b$) are explanatory diagrams during the manufacturing process for explaining the method of manufacturing the semiconductor device according to the first embodiment of the present invention (explanatory diagram following FIGS. 25($a$) and 25($b$)), in which FIG. 26($a$) is a plan view of essential parts of the semiconductor device and FIG. 26($b$) is a sectional view of essential parts of the semiconductor device.
Figure 26B:
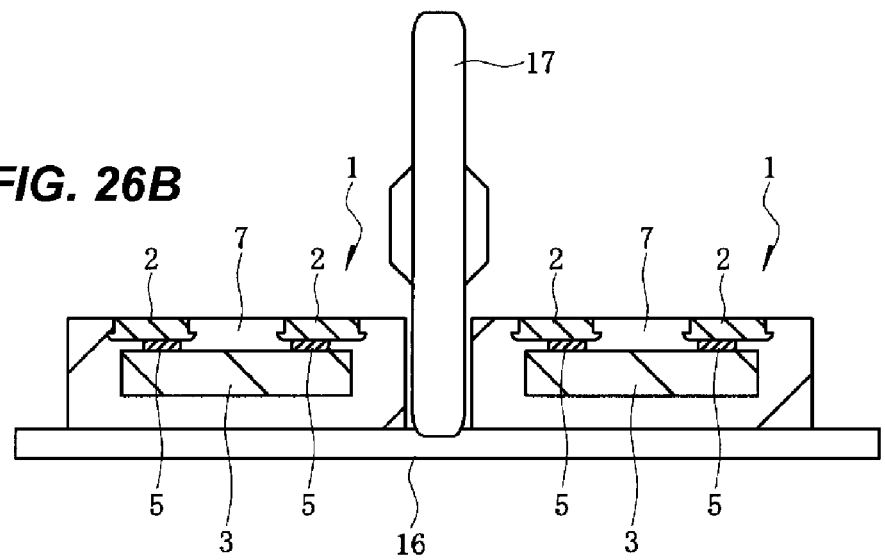

Next, as shown in FIGS. 26(a) and 26(b), a dicing tape 16 is provided. To the upper surface of the dicing tape 16, an adhesive layer is applied. Subsequently, the resin sealing body 7 covering the semiconductor chips 3, each part (upper surface and side surface) of the leads 2, and the bump electrodes 5 are fixed on the upper surface of the dicing tape 16 via the adhesive layer.

Next, by using a very thin circular blade (dicing blade) 17 to which fine diamond particles are applied, the resin sealing body 7 is cut longitudinally and transversely along the scribe area from the side of the lower surface of the resin sealing body 7. The resin sealing body 7 is singulated into the individual semiconductor device (semiconductor package) 1. The semiconductor device 1 is fixed via the dicing tape 16 after singulated. Therefore, an aligned state is kept. Subsequently, after washing the semiconductor device 1 to remove scrap etc. produced when cutting the resin sealing body 7, the adhesion of the adhesive layer is reduced by irradiation of ultraviolet beams and it becomes easy to peel off the semiconductor device 1 from the dicing tape 16.

Figure 27A:
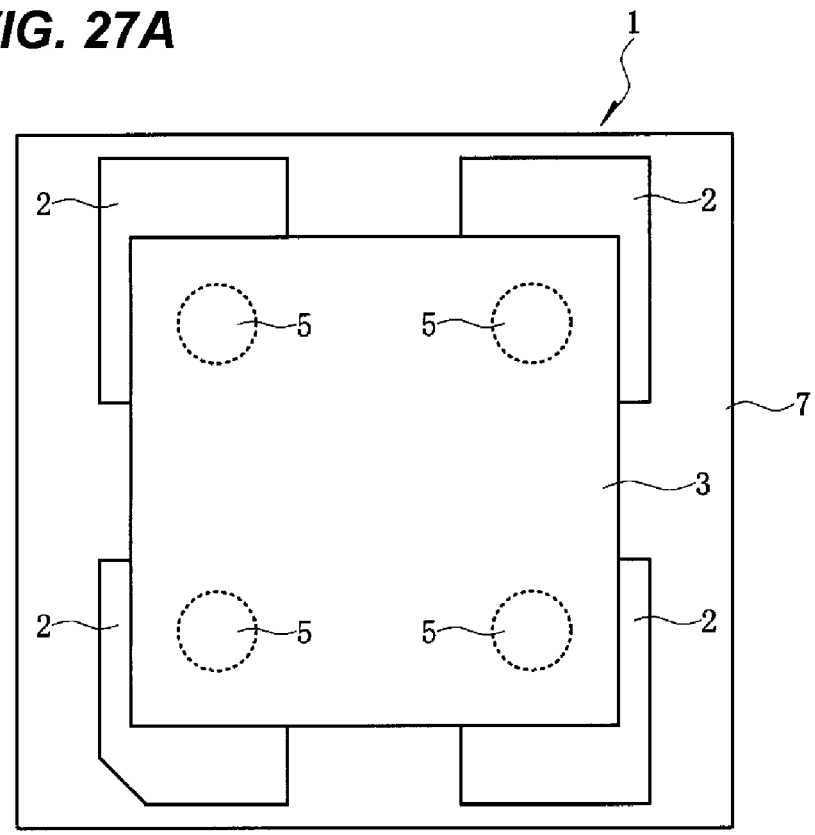
FIGS. 27($a$) and 27($b$) are explanatory diagrams during the manufacturing process for explaining the method of manufacturing the semiconductor device according to the first embodiment of the present invention (explanatory diagram following FIGS. 26($a$) and 26($b$)), in which FIG. 27($a$) is a plan view of essential parts of the semiconductor device and FIG. 27($b$) is a sectional view of essential parts of the semiconductor device.
Figure 27B:
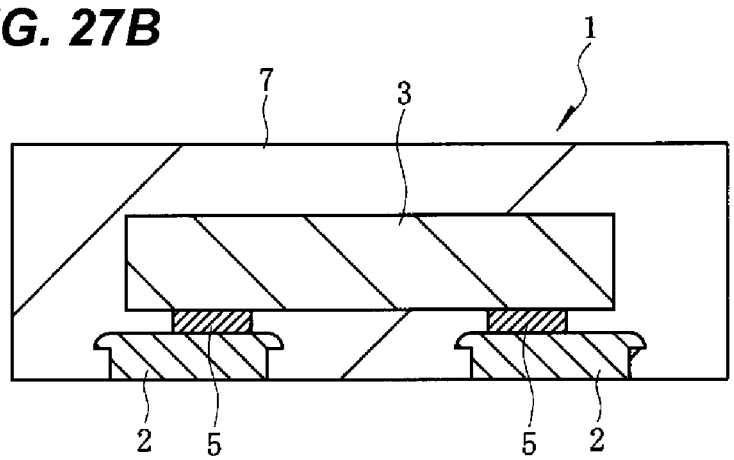

Next, as shown in FIGS. 27(a) and 27(b), by removing the dicing tape 16, the semiconductor devices 1 are separated individually. On the lower surface of the resin sealing body 7 of the semiconductor device 1, each of the lower surfaces (back surface, mounting surface) of the leads 2 is exposed.

(P109: Test Process)

Next, the semiconductor device 1 is selected according to the product standard and after the final inspection of the appearance, the product (the semiconductor 1) is completed.

(P110: Taping Process)

Next, the product (the semiconductor device 1) is accommodated in a recess formed in advance in a carrier tape. After that, the carrier tape is wound to a reel, the reel is accommodated in a moisture-proof bag, and shipped.

According to the present first embodiment, by forming the upper surface of the lead 2 into a semi-glossy surface having a roughness the maximum height (Ry) of which is in the range greater than 0 µm and not greater than 20 µm (0 µm<maximum height (Ry)≤20 µm) and the arithmetic mean roughness (Ra) of which is in the range greater than 0 µm and not greater than 0.7 µm (0 µm<arithmetic mean roughness (Ra)≤0.7 µm), it is possible to aim to improve the joint strength at each joint of the leads 2 and the bump electrodes 5 and to improve the joint failure of the bump electrodes 5.

(Second Embodiment)

Figure 28:
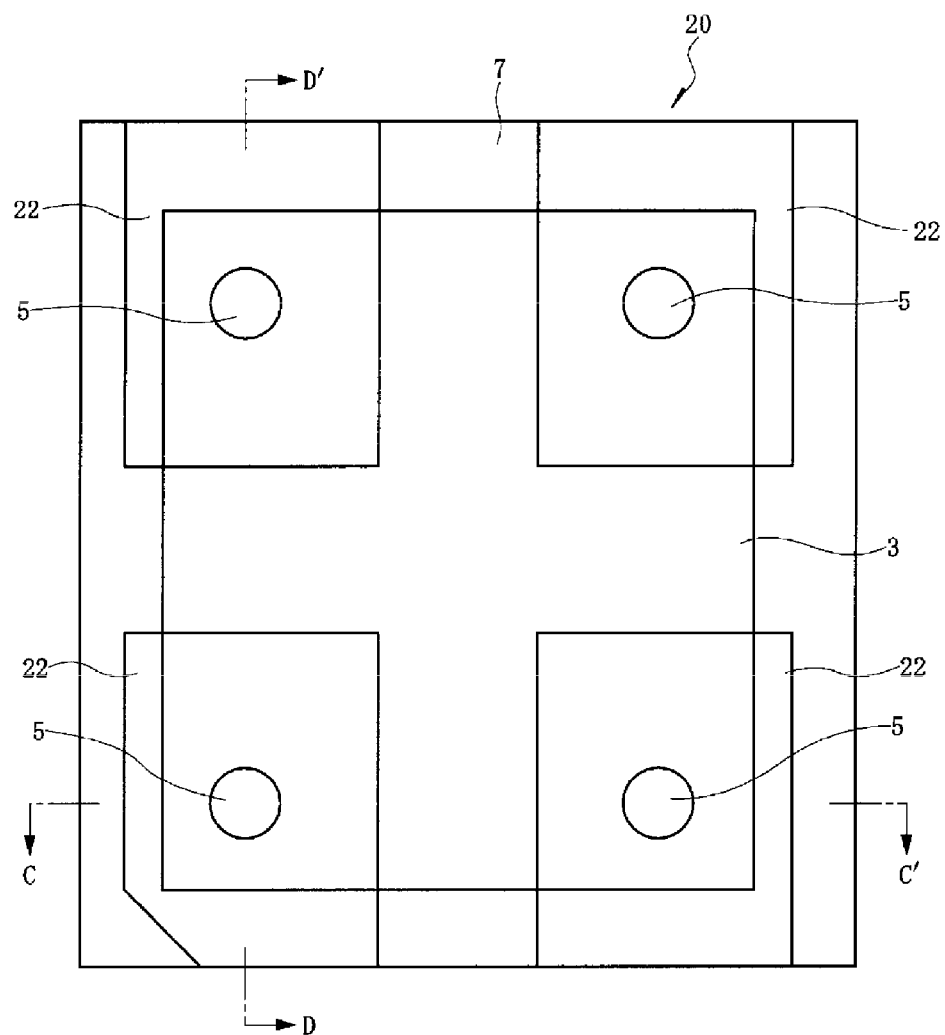
FIG. 28 is a plan view of essential parts of semiconductor device in a second embodiment of the present invention when viewed through a sealing body.
Figure 29:
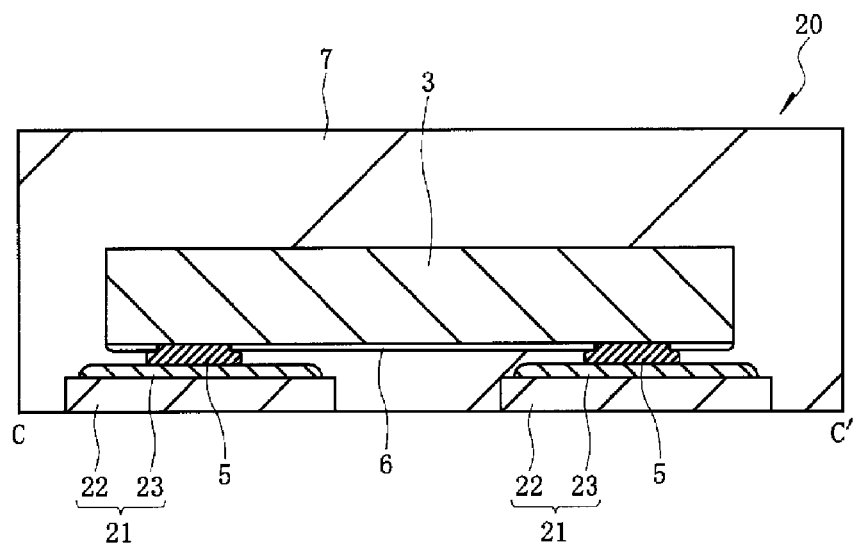
FIG. 29 is a sectional view of essential parts of the semiconductor device along C-C' line shown in FIG. 28.
Figure 30:
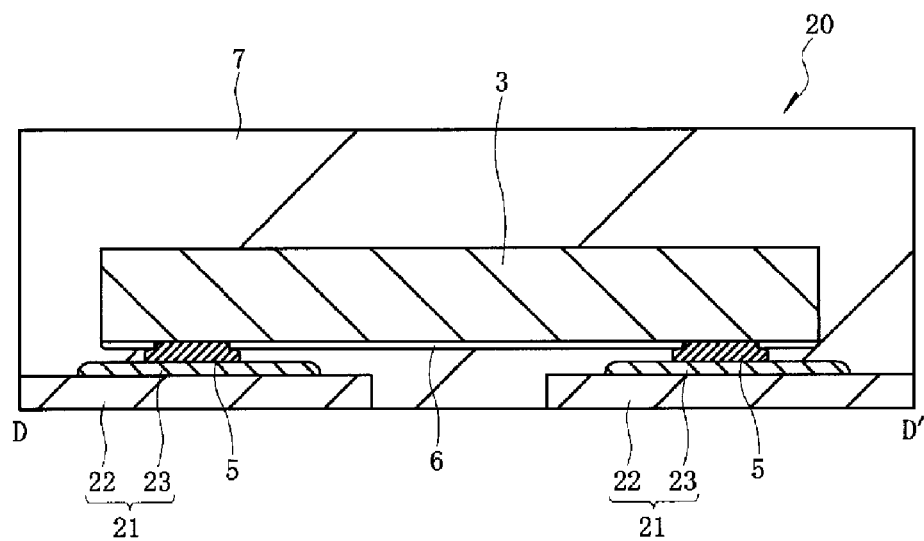
FIG. 30 is a sectional view of essential parts of the semiconductor device along D-D' line shown in FIG. 28.
Figure 31:
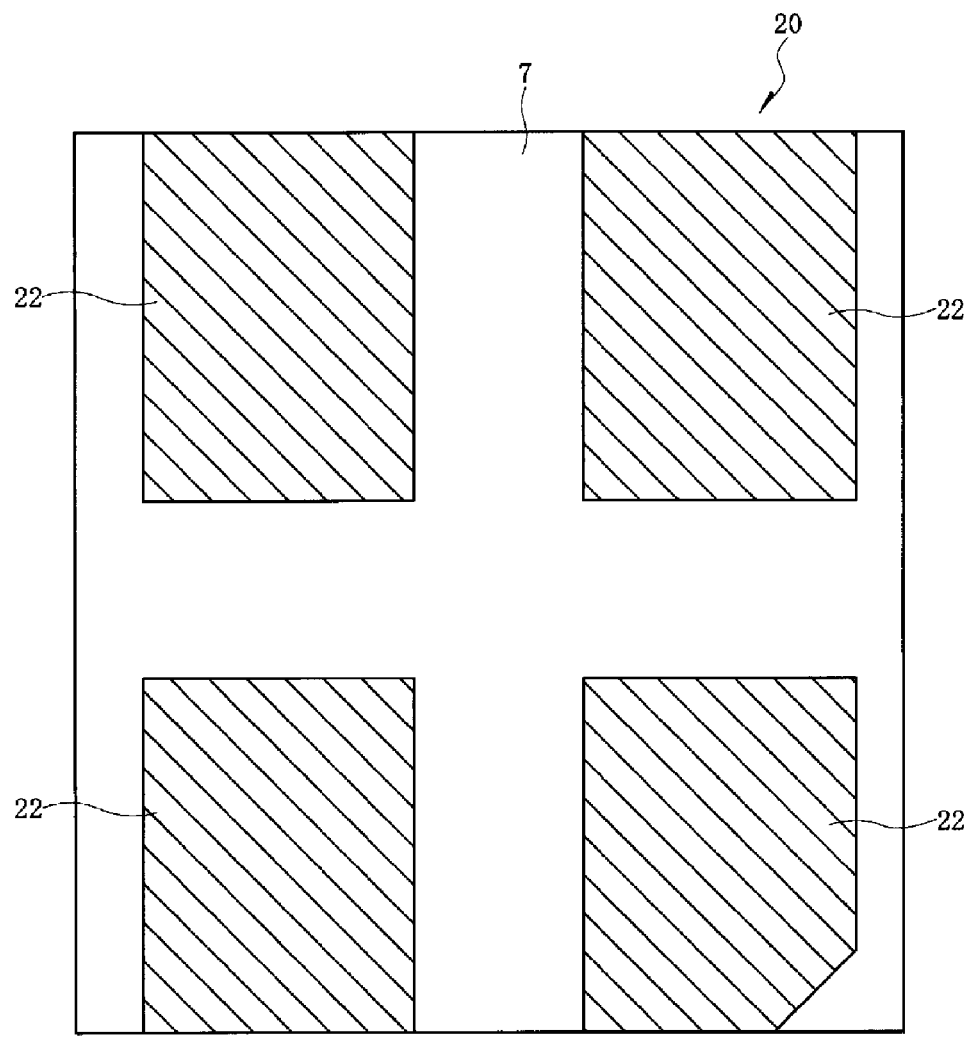
FIG. 31 is a plan view of essential parts showing a lower surface of the semiconductor device in the second embodiment of the present invention.

A semiconductor device in a second embodiment is explained using FIG. 28 to FIG. 31. FIG. 28 is a plan view of essential parts of the semiconductor device when viewed through a sealing body. FIG. 29 is a sectional view of essential parts of the semiconductor device along C-C' line shown in FIG. 28. FIG. 30 is a sectional view of essential parts of the semiconductor device along D-D' line shown in FIG. 28. FIG. 31 is a plan view of essential parts showing a lower surface of the semiconductor device. The number of leads that serve as an external terminal of the semiconductor device and the number of bump electrodes connected to these leads are the same as those in the first embodiment.

Like the semiconductor device 1 having the 4-pin external terminal according to the first embodiment, a semiconductor device 20 according to the second embodiment includes a plurality of leads (terminal, metal plate, electrically conductive pattern) 21, the semiconductor chip 3, and the bump electrodes (bump, metal bump, projecting electrode) 5 that electrically connect the leads 21 and a plurality of bonding pads (electrode pad, surface electrode) formed on the front surface (main surface) of the semiconductor chip 3.

However, the structure of the lead 21 according to the second embodiment 2 differs from the structure of the lead 2 according to the first embodiment. The lead 21 includes a base material (substrate such as lead frame) 22 including a metal member (copper (Cu) in the present second embodiment) and a plated film 23 including a gold (Au) film, silver (Ag) film, or palladium (Pd) film formed by the plating method (electrolytic plating method or electroless plating method) on the upper surface (surface) of the base material 22. Then, the bump electrode 5 is joined to the upper surface (surface) of the plated film 23.

Then, the upper surface of each plated film 23 formed on the upper surface of the base material 22 is not a planar surface (maximum height (Ry)=0) as in the first embodiment but a front surface having a roughness the maximum height (Ry) of which is in the range greater than 0 µm and not greater than 20 µm (0 µm<maximum height (Ry)≤20 µm) and the arithmetic mean roughness (Ra) of which is in the range greater than 0 µm and not greater than 0.7 µm (0 µm<arithmetic mean roughness (Ra)≤0.7 µm). Each plated film 23 is semi-glossy (glossiness is about 0.3 to 0.5).

In the first embodiment, the lead 2 includes a plated film (the gold film 2A, the nickel film 2B, and the silver film 2C (or gold film) formed by the plating method) and the roughness (the maximum height (Ry) and the arithmetic mean roughness (Ra)) of each upper surface of the lead 2 is set to a predetermined range.

In the present second embodiment, the lead 21 includes the base material 22 and the plated film 23 which is formed on the upper surface of the base material 22 by the plating method. The roughness (the maximum height (Ry) and the arithmetic mean roughness (Ra)) of the upper surface of the plated film 23 is set to a predetermined range. Even when the plated film 23 having a predetermined roughness is formed on the upper surface of the base material 22 to which at least the bump electrode 5 is joined (bump electrode joint area), it is possible to improve the joint failure of the bump electrodes 5 by increasing the joint strength at each joint of the leads 21 and the bump electrodes 5.

The invention made by the inventors of the present application is explained specifically based on the embodiments as above. The present invention is not limited to the embodiments but various modifications are possible in the scope not deviating from the gist.

In the first and second embodiments, the semiconductor device having the 4-pin external terminal is explained mainly, but, the semiconductor device is not limited to this. The present invention can be applied to a semiconductor device having a 6-pin or 9-pin external terminal or to a semiconductor device in which the number of bump electrodes is greater than the number of leads.

In the first embodiment, the shape in section of the lead 2 is the shape of a mushroom having a protruding part that bulges out in the shape of eaves is explained, but, the shape in section is not limited to this. The shape may be a quadrangular prism with no protruding part or the shape of a cylinder. In such a shape, the lead 2 becomes easy to drop off from the lower surface (mounting surface) of the resin sealing body (sealing body) 7 formed in the resin mold process compared to the shape of a mushroom. Therefore, when reliability of the semiconductor device 1 is taken into account, it is preferable to provide the protruding part on the side of the upper surface rather than on the side of the lower surface.

Further, in the second embodiment, the semiconductor device in which the lead 21 extends as far as the peripheral part (side surface) of the resin sealing body 7 is explained, but, the semiconductor device is not limited to this. Like the first embodiment, it may be possible to provide the lead 2 not extending as far as the peripheral part (side surface) of the resin sealing body 7. It may also be possible to provide the lead 2 in a position separated from this peripheral part (side surface).

The present invention can be applied to a semiconductor device having a joint at which a bonding pad formed on the front surface of a semiconductor chip and an external terminal are electrically connected via a bump electrode.

What is claimed is:

1. A semiconductor device comprising:
    a plated film; and
    a semiconductor chip having a front surface, a bonding pad formed on the front surface, and a back surface opposite to the front surface, and disposed over the plated film via a bump electrode such that the front surface faces the plated film,
    wherein the bump electrode contacts an upper surface of the plated film; and
    wherein a maximum height (Ry) of the roughness of the upper surface of the plated film is larger than 0 μm, and less than or equal to 20 μm.

2. The semiconductor device according to claim 1,
    wherein an arithmetic mean roughness (Ra) of the roughness of the upper surface of the plated film is in a range greater than 0 μm and less than 0.7 μm.

3. The semiconductor device according to claim 1,
    wherein the plated film contains metal particles grown in the horizontal direction with respect to the upper surface of a substrate.

4. The semiconductor device according to claim 1,
    wherein the plated film includes a nickel film and a silver film or gold film formed over the nickel film.

5. The semiconductor device according to claim 1, further comprising:
    a sealing body that seals a joint of the plated film and the bump electrode.

6. The semiconductor device according to claim 5,
    wherein the sealing body has a top surface, a bottom surface opposite to the top surface, and a side surface between the top surface and the bottom surface;
    wherein the plated film is not exposed from the side surface of the sealing body; and
    wherein a part of the plated film is exposed from the bottom surface of the sealing body.

7. The semiconductor device according to claim 1,
    wherein the plated film has a lower surface opposite to the upper surface thereof; and
    wherein the lower surface area is smaller than the upper surface area.

8. The semiconductor device according to claim 1,
    wherein the plated film is formed over an upper surface of a lead facing the semiconductor chip; and
    wherein a sealing body seals the plated film and a part of the lead.

* * * * *